United States Patent [19]
Kuriyama

[11] Patent Number: 5,689,458
[45] Date of Patent: Nov. 18, 1997

[54] SEMICONDUCTOR MEMORY DEVICE HAVING NEGATIVE RESISTANCE ELEMENT OPERATED STABLY WITH SINGLE LOW POWER SOURCE

[75] Inventor: Hirotada Kuriyama, Hyogo, Japan

[73] Assignee: Mitsubishi Denki Kabushiki Kaisha, Tokyo, Japan

[21] Appl. No.: 628,200

[22] Filed: Apr. 5, 1996

[30] Foreign Application Priority Data

Jun. 8, 1995 [JP] Japan .................................. 7-141789

[51] Int. Cl.$^6$ .................................................. G11C 11/00
[52] U.S. Cl. .................................... 365/159; 365/174
[58] Field of Search ........................... 365/159, 71, 174

[56] References Cited

U.S. PATENT DOCUMENTS

| | | | |
|---|---|---|---|
| 4,376,986 | 3/1983 | Elmasry et al. | 365/159 |
| 4,788,662 | 11/1988 | Mori | 365/159 |
| 4,849,934 | 7/1989 | Yokoyama et ald. | 365/159 |
| 5,390,145 | 2/1995 | Nakasha et al. | 365/159 |

FOREIGN PATENT DOCUMENTS

| | | |
|---|---|---|
| 2-109361 | 4/1990 | Japan . |
| 3-104161 | 1/1991 | Japan . |
| 5-291533 | 11/1993 | Japan . |

OTHER PUBLICATIONS

Physics of Semiconductor Devices, by S.M. Sze pp. 549–553.

"A Novel High School Density SRAM Cell Utilizing a Bistable GeSi/Si Tunnel Diode" by T.K. Carns et al., 1994 IEEE pp. 381–384.

"A Vertical I-Shape Transistor (VIT) Cell for Gbit DRAM and Beyond" by Maeda et al., 1994 Symposium on VLSI Technology Digest Papers pp. 133–134.

Primary Examiner—David C. Nelms
Assistant Examiner—Hien Nguyen
Attorney, Agent, or Firm—Lowe, Price, LeBlanc & Becker

[57] ABSTRACT

A memory cell of an SRAM includes an access transistor, and an MIS switching diode. The access transistor has a drain electrode connected to a bit line of a corresponding column, a source electrode connected to a storage node, and a gate electrode connected to a word line of a corresponding row. The threshold voltage of the access transistor is small than the threshold voltage of a bit line load transistor. The MIS switching diode is connected between the storage node and a second power supply potential node. The switching initiate voltage of the MIS switching diode is greater than the difference between the first potential and the threshold voltage of the bit line load transistor, and smaller than the difference between the first potential and the threshold voltage of the access transistor. Thus, data can be read/ written and held accurately.

13 Claims, 18 Drawing Sheets

SEMICONDUCTOR MEMORY DEVICE HAVING NEGATIVE RESISTANCE ELEMENT OPERATED STABLY WITH SINGLE LOW POWER SOURCE

BACKGROUND OF THE INVENTION

1. Field of the Invention

The present invention relates to semiconductor memory devices and integrated semiconductor, devices. More particularly, the present invention relates to a semiconductor memory device and an integrated semiconductor device including a memory cell having a negative resistance element.

2. Description of the Background Art

A static random access memory (referred to as SRAM hereinafter) including a memory cell having an MIS switching diode which is a negative resistance element is disclosed in Japanese Patent Laying-Open No. 3-10416, for example. FIG. 23 is a circuit diagram showing a memory cell MC of the SRAM disclosed in Japanese Patent Laying-Open No. 3-10416. Referring to FIG. 23, a memory cell MC includes an access transistor 1 formed of an N channel MOS transistor, a load element 3 formed of a resistance element of a high resistance, and a negative resistance element 5 formed of an MIS switching diode. Access transistor 1 has a drain electrode connected to a bit line BL of a corresponding column, a source electrode connected to a storage node 2, and a gate electrode connected to a word line WL of a corresponding row. Load element 3 is connected between a first power supply potential node 4 to which a power supply potential $V_{DD}$ is applied and storage node 2. The relationship (resistance characteristic) between potential V in storage node 2 and current I flowing through load element 3 is indicated in FIG. 25 by dotted line β. Negative resistance element 5 is connected between storage node 2 and a second power supply potential node 6 to which a ground potential GND is applied. The relationship (negative resistance characteristic) between potential V in storage node 2 and current I flowing through negative resistance element 5 is shown in FIG. 25 by solid line α. It is appreciated from FIG. 25 that the relationship exhibits a rough S shape with point "b" as a switching initiate voltage $V_0$.

Points A and B in FIG. 25 show the stable points of respective data storage (potential state of storage node 2). Point A shows the state where information "1" ($V_H$) is stored, and point B shows the state where information "0" ($V_L$) is stored.

FIG. 24 is a sectional view of a structure of negative resistance element 5. Referring to FIG. 24, negative resistance element 5 includes an N type semiconductor region 101 formed in an SOI (Silicon-On-Insulator) substrate, and electrically connected to second power supply node 6, a P type semiconductor region 102 formed on N type semiconductor region 101 and establishing a PN junction with N type semiconductor region 101, a tunnel insulation film 103 formed on a surface of P type semiconductor region 102 in the SOI substrate, and a polysilicon electrode 104 formed on a surface of tunnel insulation film 103, and electrically connected to storage node 2.

An operation of a memory cell MC of the above structure will be described hereinafter.

In writing data into memory cell MC, $V_{CC}$ (a positive potential, higher than switching initiate voltage $V_0$) is applied to a word line WL in a corresponding row to select memory cell MC, whereby access transistor 1 is rendered conductive. According to write data, a potential of $V_{CC}$ or 0 V is applied to bit line BL in a corresponding column, whereby the potential of storage node 2 is set to the level of $V_{CC}$ or 0 V.

The operation state of negative resistance element 5 shows a transition to point B and point A in FIG. 25 when the potential of storage node 2 is $V_{CC}$ and 0 V, respectively. The stored data is held thereafter by a current according to power supply potential $V_{DD}$ supplied from first power supply potential node 4 via negative resistance element 5.

In an SRAM including a memory cell MC having such a MIS switching diode, the above-described operation is carried out in the case of a unitary memory cell. However, interference in the operation between each memory cell MC occurs when a plurality of memory cells MC are arranged in an array. More specifically, erroneous writing into a non-selected memory cell MC connected to a selected word line WL occurs. The aforementioned Japanese Patent Laying-Open No. 3-10416 does not teach in detail how data is written, read, and maintained when a plurality of memory cells are arranged in an array.

SUMMARY OF THE INVENTION

In view of the foregoing, an object of the present invention is to provide a semiconductor memory device including a memory cell having a negative resistance element that can have data written, read, and held accurately with a single power source of low voltage.

Another object of the present invention is to provide an integrated semiconductor device including a memory cell having an MIS switching diode that can be operated stably with a single power source of low voltage.

A further object of the present invention is to provide an integrated semiconductor device including a memory cell having an MIS switching diode that can be manufactured easily and economically with no complicated manufacturing steps.

In a semiconductor memory device according to an aspect of the present invention, a switching initiate voltage of a negative resistance element is set to a value greater than the difference between a first potential and a threshold voltage of a bit line load transistor, and smaller than the difference between the first potential and a threshold voltage of an access transistor. Data can be written into a selected memory cell accurately with no damage of data in a non-selected memory cell by a single power source. Also, data can be read out accurately from a selected memory cell. Furthermore, data in a memory cell can be retained at low current consumption.

According to an integrated semiconductor device of another aspect of the present invention, an MIS switching diode includes a semiconductor region of a first conductivity type, a semiconductor region of a second conductivity type, a tunnel insulation film, and an electrode. The first conductivity type semiconductor region is formed exposed at a main surface of the semiconductor substrate. The depth of the first conductivity type semiconductor region is 0.05 μm–1 μm. The impurity concentration thereof is $1 \times 10^{17}/cm^3 – 1 \times 10^{19}/cm^3$. The second conductivity type semiconductor region is formed beneath the first conductivity type semiconductor region at the main surface of the semiconductor substrate, and forms a junction with the first conductivity type semiconductor region. The second conductivity type semiconductor region is electrically connected to the second power supply potential node. The tunnel insulation film is formed on the main surface of the semiconductor substrate, in contact with the exposed face of the first conductivity type semiconductor region. The tunnel insulation film is formed of a silicon oxide film of 25 Å–50 Å in thickness, a silicon nitride film of 50 Å–70 Å in thickness, or a silicon nitride oxide film of 30 Å–60 Å in thickness. The electrode is formed of a conductive layer on the surface of the tunnel insulation film and is electrically connected to the storage node. A stable operation is allowed with a single power source of a low voltage of 1 V–3 V.

According to an integrated semiconductor device of a further aspect of the present invention, a semiconductor substrate includes first and second formation regions respectively surrounded by an isolation insulation film at the main surface thereof.

An access transistor includes a pair of first electrode/ second electrode regions formed on the first formation region of the semiconductor substrate, one electrode region thereof being electrically connected to a read/write node, and an input electrode of a first conductor layer formed on the first formation region between the first electrode/second electrode regions with a gate insulation film thereunder.

An MIS switching diode includes a semiconductor region of a first conductivity type, a semiconductor region of a second conductivity type, a tunnel insulating film, and an electrode. The first conductivity semiconductor region is formed at the second formation region of the semiconductor substrate with an exposed surface. The second conductivity semiconductor region is formed beneath the first conductivity type semiconductor region in the second formation region, and forms a junction with the first conductivity type semiconductor region. The second conductivity type semiconductor region is electrically connected to a second power supply potential node. The tunnel insulation film is formed on the second formation region and in contact with the exposed face of the first conductivity type semiconductor region. The electrode of a second conductor layer different from the first conductor layer is formed on the surface of the tunnel insulation film.

A negative element includes a pair of low resistance portions formed of a third conductor layer differing from the first and second conductor layers, and a high resistance portion located between the pair of low resistance portions. One of the pair of low resistance portions is electrically connected to the other of the pair of first electrode/second electrode regions of the access transistor and to the electrode of the MIS switching diode. The other of the pair of low resistance portions is electrically connected to the first power supply potential node. An integrated semiconductor device can be manufactured easily and economically with no complicated manufacturing steps.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
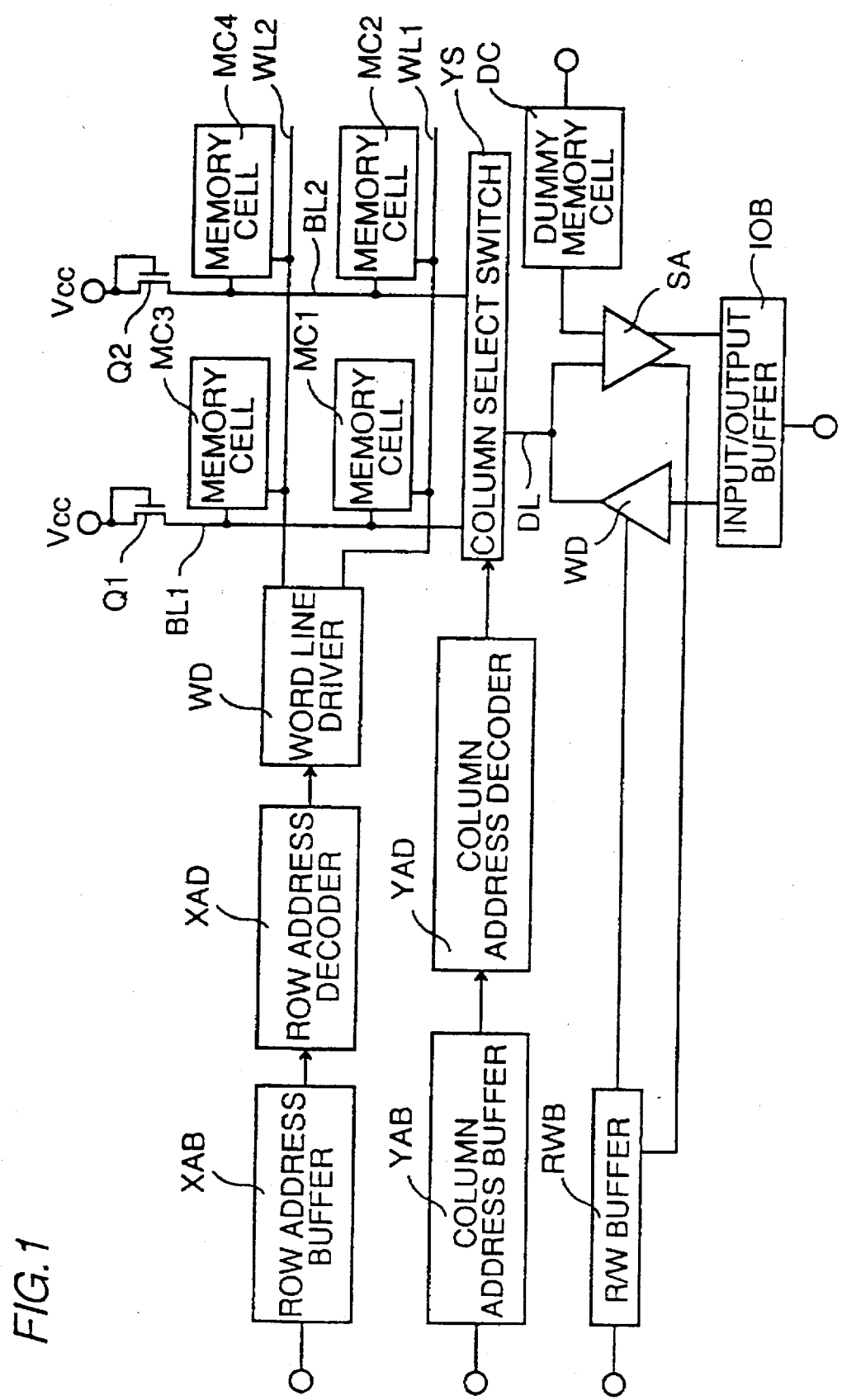
FIG. 1 is a circuit block diagram showing a structure of an SRAM according to a first embodiment of the present invention.

FIG. 1 is a block diagram of a structure of an SRAM with a portion thereof omitted. Referring to FIG. 1, an SRAM of a first embodiment of the present invention includes a plurality of word lines WL1 and WL2 disposed at respective corresponding one of a plurality of rows (for the sake of convenience, only two rows are shown), a plurality of bit lines BL1 and BL2 disposed in respective corresponding one of a plurality of columns (for the sake of convenience, only two columns are shown), and a plurality of bit line load transistors Q1 and Q2 formed of an N channel MOS transistor connected between one end of a corresponding one of a plurality of bit lines BL1 and BL2 and a first power supply node to which a first potential $V_{CC}$ is supplied.

The SRAM includes a plurality of memory cells MC1–MC4 arranged in corresponding ones of a plurality of rows and columns (for the sake of convenience, only memory cells corresponding to two rows and two columns are shown). Each of memory cells MC1–MC4 is connected to a word line WL disposed at a corresponding row, and to a bit line BL disposed at a corresponding column.

Figure 2:
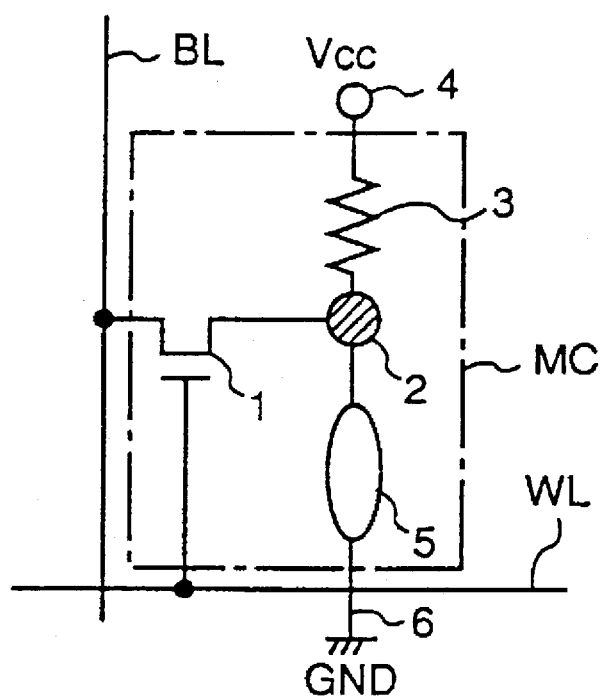
FIG. 2 is an equivalent circuit diagram showing a structure of the memory cell shown in FIG. 1.

As shown in FIG. 2, a memory cell MC includes an access transistor 1 formed of an N channel MOS transistor, a load element 3 formed of a resistance element having a high resistance, and a negative resistance element 5 formed of an MIS switching diode. Access transistor 1 has a drain electrode connected to bit line BL of a corresponding column, a source electrode connected to a storage node 2, and a gate electrode connected to a word line WL of a corresponding row. A threshold voltage Vth (A) of access transistor 1 is set to a value smaller than a threshold voltage Vth (B) of bit line load transistors Q1 and Q2. Load element 3 is connected between first power supply potential node 4 to which first potential $V_{CC}$ is supplied, and a storage node 2. Negative resistance element 5 is connected between storage node 2 and a second power supply node 6 to which ground potential GND (second potential) is supplied. Switching initiate voltage $V_0$ of negative resistance element 5 is set to a value greater than the difference between first potential $V_{CC}$ and threshold voltage Vth (B) of bit line load transistors Q1 and Q2, and smaller than the difference between first potential $V_{CC}$ and threshold voltage Vth (A) of access transistor 1, and greater than 1/2 the first potential $V_{CC}$.

Referring to FIG. 1 again, the SRAM includes a row address buffer XAB, a row address decoder XAD, and a word line driver WD. Row address buffer XAB receives an externally applied row address signal for providing an internal row address signal. Row address decoder XAD receives an internal row address signal from row address buffer XAD to provide a row decode signal for selecting one of a plurality of word lines WL1 and WL2. Word line driver WD receives a row decode signal from row address decoder XAD to supply first potential $V_{CC}$ to word line WL selected according to the received row decode signal, and maintains the potential of a non-selected word line at a second potential (ground potential GND).

The SRAM further includes a column address buffer YAB, a column address decoder YAD, and a column select switch YS. Column address buffer YAB receives an externally applied column address signal for providing an internal column address signal. Column address decoder YAD receives an internal column address signal from column address buffer YAB for providing a column decode signal to select one of a plurality of bit lines BL1 and BL2. Column select switch YS receives a column decode signal from column address decoder YAD to connect bit line BL selected according to the received decode signal to a data line DL, and maintains a non-connected state of a non-selected bit line BL and a data line DL.

The SRAM further includes a read/write buffer RWB, a write driver WD forming a write circuit, a sense amplifier SA forming a read out circuit, a dummy memory cell DC forming a comparison potential generation circuit, and an input/output buffer IOB. Read/write buffer RWB receives an externally applied read/write signal for providing an internal read/write signal. Write driver WD receives an internal read/write signal from read/write buffer RWB to be rendered active when the internal read/write signal indicates writing (when internal read/write signal attains an L level (logical low) in the first embodiment), whereby data according to the input write data is provided onto data line DL. More specifically, write driver WD includes an CMOS inverter having a P type MOS transistor and an N type MOS transistor connected in series as an output stage. According to this CMOS inverter, data is provided to data line DL so that selected bit line BL is driven to a level identical to first potential $V_{CC}$ and a second potential (ground potential GND) when the input write data indicates "0" and "1", respectively.

Sense amplifier SA receives an internal read/write signal from read/write buffer RWB. When the received internal read/write signal indicates reading (when internal read/write signal attains an H level (logical high) in the first embodiment), sense amplifier SA is rendered active to compare the potential on data line DL according to data read out from a selected memory cell MC and a comparison potential VR to provide a readout data output. More specifically, sense amplifier SA provides data of an H level (indicating "1") and an L level (indicating "0") when the potential on data line DL is higher and lower, respectively, than comparison potential $V_R$. Dummy cell DC provides comparison potential $V_R$ to sense amplifier SA. Comparison potential $V_R$ is set to a potential between potential $V_H$ read out on bit line BL when data of an H level is stored in memory cell MC, and potential $V_L$ read out on bit line BL when data of an L level is stored in memory cell MC, most preferably, to a potential of $(V_H+V_L)/2$.

Input/output buffer IOB receives an externally applied write data, which is provided to write driver WD, and also receives read data from sense amplifier SA, which is output as readout data.

Figure 3:
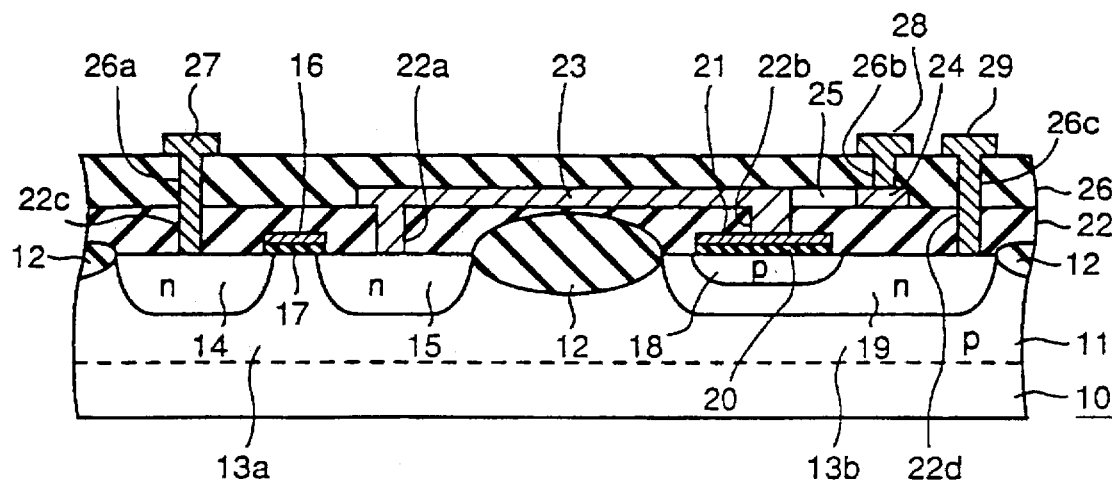
FIG. 3 is a sectional view showing a structure of the memory cell of FIG. 2.

FIG. 3 is a sectional view of a memory cell MC formed on a main surface of a semiconductor substrate 10. Referring to FIG. 3, a P type well region 11 is formed on a main surface of an N type semiconductor substrate 10. An isolation insulation film 12 is formed on a surface of well region 11. Well region 11 is divided into a first formation region 13a and a second formation region 13b by isolation insulation film 12.

An N type impurity region, i.e. a pair of source/drain regions 14 and 15 are formed at the surface of first formation region 13a. One of source/drain regions 14 is electrically connected to a read out/write node which is a node with a corresponding bit line BL of FIG. 2. A gate insulation film (silicon oxide film) 17 is formed on first formation region 13a between source/drain regions 14 and 15. A gate electrode 16 is formed of a first conductor layer (polysilicon layer) on the surface of gate insulation film 17. Gate electrode 16 is formed integrally with word line WL of a corresponding row.

Access transistor 1 of FIG. 2 is formed of a pair of source/drain regions 14 and 15, and gate electrode 16. Gate electrode 16 may not be formed integrally with word line WL. In this case, gate electrode 16 is electrically connected to a cell select node which is the connection node with word line WL.

A P type semiconductor region 18 is formed with an exposed face in second formation region 13b. P type semiconductor region 18 has a depth of 0.05 μm–1 μm and an impurity concentration of $1\times10^{17}/cm^3$–$1\times10^{19}/cm^3$. An N type semiconductor region 19 is formed beneath P type semiconductor region 18 establishing a PN junction therewith. N type semiconductor region 19 is electrically connected to second power supply potential node 6 shown in FIG. 2. The entire circumference of the PN junction portion between N type semiconductor region 19 and well region 11 is in contact with isolation insulation film 12 enclosing second formation region 13b.

A tunnel insulation film 20 is formed on second formation region 13b in contact with the exposed face of P type semiconductor region 18. Tunnel insulation film 20 is formed of any of a silicon oxide film of 25 Å–50 Å in thickness, a silicon nitride film of 50 Å–70 Å in film thickness, and a silicon nitride oxide film of 30 Å–60 Å in thickness. An electrode 21 of a second conductor layer (polysilicon layer) located upper than the first conductor layer is formed on the surface of tunnel insulation film 20. Electrode 21 is electrically connected to storage node 2 of FIG. 2. The thickness thereof is at least 1500 Å, for example, 2000 Å.

Negative resistance element 5 (MIS switching diode) of FIG. 2 is formed of the above-described P type semiconductor region 18, N type semiconductor region 19, tunnel insulation film 20 and electrode 21.

A first interlayer insulation film 22 is formed on the second conductor layer. On first interlayer insulation film 22, a pair of low resistance portions 23 and 24 is formed and a high resistance portion 25 between low resistance portions 23 and 24, corresponding to load element 3 of FIG. 2, and formed of a third conductor layer (polysilicon layer) upper than the second conductor layer are provided. One low resistance portion 23 is electrically connected to one source/drain region 15 of access transistor 1 and electrode 21 of the MIS switching diode via contact holes 22a and 22b, respectively, provided in first interlayer insulation film 22. Low resistance portion 23 forms storage node 2 of FIG. 2. The other low resistance portion 24 is electrically connected to first power supply potential node 4 of FIG. 2.

A second interlayer insulation film 26 is formed on the second conductor layer. A bit line 27 (indicated as BL in FIG. 2) of a conductor layer such as aluminum is formed on second interlayer insulation film 26 at right angles (not explicitly shown in FIG. 3) with word line WL formed integral with gate electrode 16 of access transistor 1. Bit line 27 is connected to one source/drain region 14 of access transistor 1 of memory cell MC of a corresponding column via contact hole 22c in first interlayer insulation film 22 and contact hole 26a in second interlayer insulation film 26.

A first power supply potential line 28 of a conductor layer identical to that of bit line 27 is formed on second interlayer insulation film 26 in parallel with bit line 27. First power supply potential line 28 is connected to the other low resistance portion 24 of load element 3 of memory cell MC of a corresponding column via a contact hole 26b in second interlayer insulation film 26. At least one end of first power supply potential line 28 is electrically connected to first power supply potential node 4 of FIG. 2. A second power supply potential line 29 of a conductor layer identical to that of bit line 27 is formed on second interlayer insulation film 26 in parallel with bit line 27. Second power supply potential 29 is electrically connected to N type impurity region 19 of negative resistance element 5 of memory cell MC of a corresponding column via a contact hole 22d in first interlayer insulation film 22 and a contact hole 26c in second interlayer insulation film 26. At least one end of second power supply potential line 29 is electrically connected to second power supply potential node 6 of FIG. 2.

Figure 4:
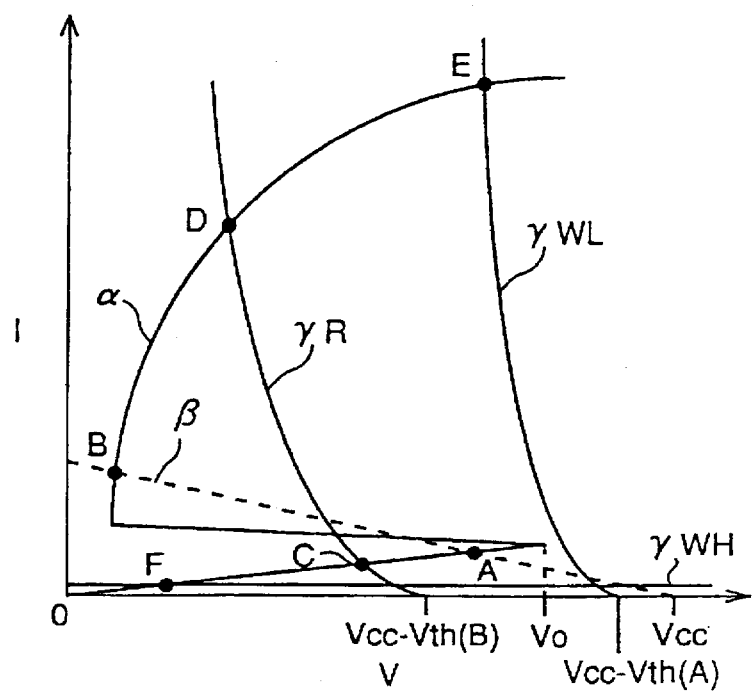
FIG. 4 is a current-voltage characteristic diagram of each element in the memory cell of FIG. 2.

FIG. 4 is a graph showing current-voltage characteristics of a memory cell MC, where a potential V of storage node 2 is plotted along the abscissa, and a current I flowing through respective elements forming a memory cell MC is plotted along the ordinate.

Curve α in a bold solid line represents the current-voltage characteristics (negative resistance characteristic) of negative resistance element 5. The straight dotted line β represents the current-voltage characteristics (resistance characteristic) of load element 3. Curve γWH in a thin solid line represents the current-voltage characteristics of access transistor 1 in writing data "0" (L level) into memory cell MC (first potential $V_{CC}$ is applied to selected bit line BL). The thin solid straight line γWL represents the current-voltage characteristics of access transistor 1 in writing data "1" (H level) into memory cell MC (ground potential GND (second potential) is applied to selected bit line BL). Curve $\gamma_{R\ in\ a}$ thin solid line represents the current-voltage characteristics of access transistor 1 in reading out data from a memory cell MC (a level of first potential $V_{CC}$ minus threshold voltage Vth (B) of bit line load transistors Q1 and Q2 is applied to bit line BL). Points A and B are respective crossing points between curve α and straight line β. Points C and D are respective crossing points between curve α and curve $\gamma_R$. Point E is a crossing point between curve α and curve γWH. Point F is the crossing point between curve α and straight line γWH.

Points A and B indicate the stable point (state of potential of storage node 2) in storing data. Points A and B show the states of storing data "1" (H level) and data "0" (L level), respectively. Vth (A) is the threshold voltage of the access transistor 1, and Vth (B) is the threshold voltage of bit line load transistors Q1 and Q2.

Figure 5:
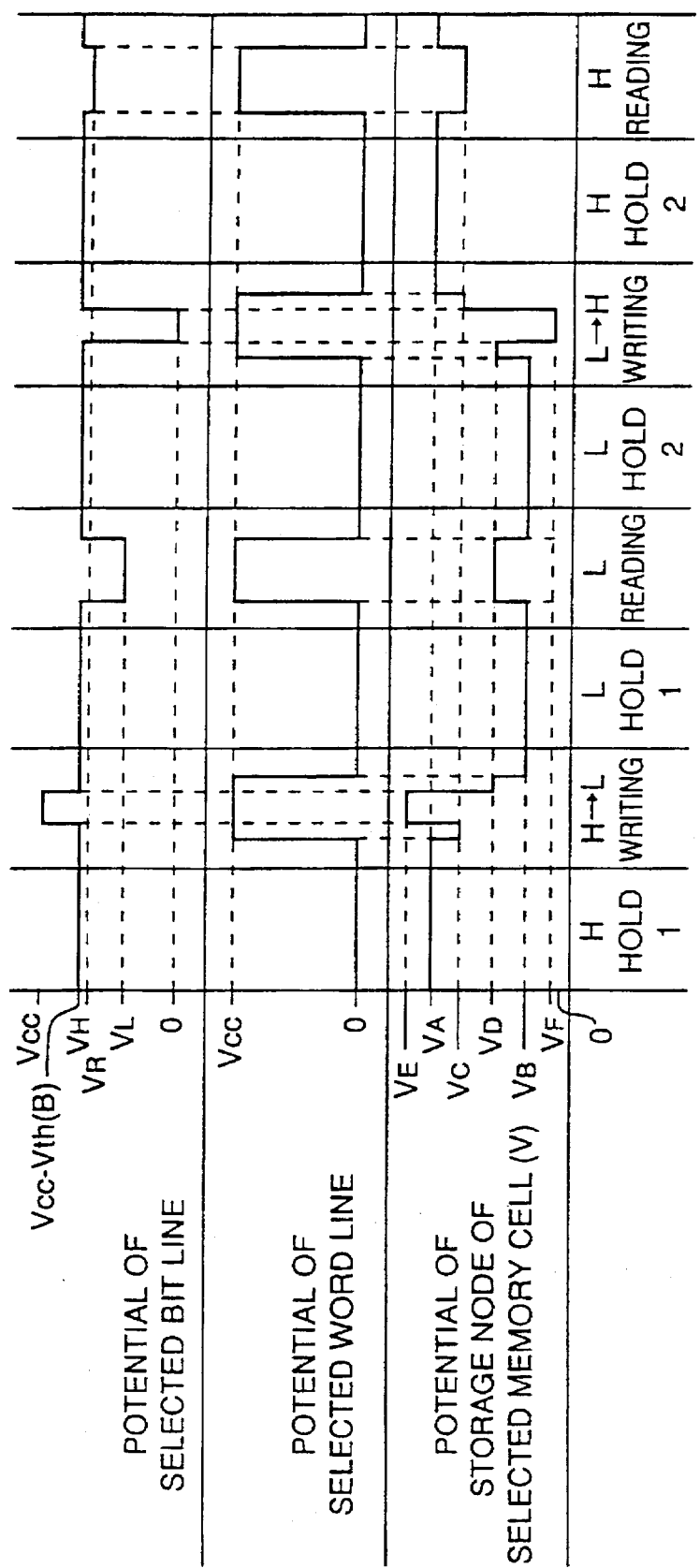
FIG. 5 is a waveform diagram showing values of the potential of a selected bit line and a selected word line, and potential V of a storage node of a selected memory cell, in various, operations.

An operation of the above SRAM, i.e., writing and reading out data to and from a memory cell MC, and retaining data in memory cell MC will be described hereinafter with reference to the waveform diagram of FIG. 5.

First, an operation of writing data into memory cell MC will be described.

Here, it is assumed that data "1" is held in memory cell MC1 (an H level, where the potential of storage node 2 attains the level of potential $V_A$ at point A in FIG. 4 in a stable state (holding state)), and data "0" is to be written therein (an L level, where the potential of source node 2 attains the level of potential $V_B$ of point B in FIG. 4 in a stable state (holding state)). (Refer to the writing period of H→L in. FIG. 5).

When memory cell MC1 is selected, a word line WL1 is pulled up to an H level (first potential $V_{CC}$) by row address buffer XAB, row address decoder XAD, and word line driver WD. Here, a word line WL2 attains an L level (second potential: ground potential GND) since it is not selected. Access transistors 1 in memory cells MC3 and MC4 connected to word line WL2 continue their non-conductive states. Therefore, respective storage nodes 2 in memory cells MC3 and MC4 are not connected to bit lines BL1 and BL2, and maintain the retaining state impervious to any affect.

When word line WL1 is driven to an H level, access transistor 1 of memory cell MC1 is rendered conductive, whereby storage node 2 is connected to bit line BL1, and also to first power supply potential node 4 via bit line load transistor Q1. Since the resistance value of load element 3 is very high and the difference between first potential $V_{CC}$ and threshold voltage Vth (B) of bit line load transistor Q1 is lower than switching initiate voltage $V_0$ of negative resistance element 5 ($V_{CC-Vth\ (B)} < v0$), current is conducted through a path of first power supply potential node 4, bit line load transistor Q1 bit line BL1 and access transistor 1. As a result, the potential of storage node 2 attains the potential level of $V_C$ at point C at the crossing of curve $\gamma_R$ and curve α in FIG. 4.

Write driver WD includes a CMOS inverter having a P type MOS transistor and an N type MOS transistor connected in series at an output stage. The CMOS inverter is activated by a read/write signal from read/write buffer RWB, and potential $V_{CC}$ according to data "0" applied via input/output buffer IOB is supplied to data line BL of the CMOS inverter. Then, bit line BL1 is selected by column address buffer YAB, column address decoder YAD, and column select switch YS. Bit line BL1 is electrically connected to data line DL, whereby the potential of bit line BL1 is driven to the level of first potential $V_{CC}$ by write driver WD.

Since switching initiate voltage $V_0$ of negative resistance element 5 is smaller than the difference between first potential $V_{CC}$ and threshold voltage Vth (A) of access transistor 1 ($V_0 < V_{CC}$ −Vth (A)), the potential of storage node 2 in memory cell MC1 is driven from the level of point C to the potential of $V_E$ at point E which is the crossing between curve γWL and curve α via points A, B and D.

More specifically, negative resistance element 5 applies a positive potential to electrode 21 of FIG. 3 (equal to potential of storage node 2) to boost the potential thereof, whereby a depletion layer expands from the surface of P type semiconductor region 18 towards N type semiconductor region 19. Negative resistance element 5 attains a non-conductive state and the current flowing thereto is very small until the depletion layer completely reaches N type semiconductor region 19 (refer to the linear portion of curve α including points A and C in FIG. 4).

When the positive potential is further increased and the depletion layer reaches N type semiconductor region 19, i.e. the positive potential applied to electrode 21 reaches the level of switching initiate voltage $V_0$, current flows from N type semiconductor region 19 to which ground potential GND (second potential) is applied into electrode 21 via P type semiconductor region 18 and tunnel insulation film 20. Although the potential of electrode 21 is once rapidly reduced, the level thereof becomes higher as the current increases (refer to the curve portion including points B, D, and E in curve α in FIG. 4).

Then, the potential attains the level of potential $V_E$ at point E which is the crossing between γWL and curve α of access transistor 1 in response to first potential $V_{CC}$ applied to bit line BL1.

Here, access transistor 1 in memory cell MC2 connected to the selected word line WL1 is rendered conductive, whereby storage node 2 and bit line BL2 are electrically connected. However, bit line BL2 and data line DL are electrically non-connected. Although current flows towards storage node 2 from first power supply potential node 4 via bit line load transistor Q2, data in memory cell MC2 will not be inverted. More specifically, when data of an L level is stored in memory cell MC2, the potential of storage node 2 attains the level of potential $V_C$ at point C which is the crossing between curve $\gamma_R$ and curve α in FIG. 4. When data of an H level is stored in memory cell MC, the potential of storage node 2 attains the level of potential $V_D$ at point D which is the crossing between curve $\gamma_R$ and curve α of FIG. 4. The data in memory cell MC2 will not be inverted since the difference between first potential $V_{CC}$ and threshold voltage Vth (B) of bit line load transistor Q2 is smaller than switching initiate voltage $V_0$ of negative resistance element 5.

Then, selected bit line BL1 is electrically disconnected from data line DL, whereby current flows through a path of first power supply potential node 4, bit line load transistor Q1, bit line BL1 and access transistor 1. The potential of storage node 2 first attains the level of voltage $V_D$ at point D which is the crossing between curve $\gamma_R$ and curve α in FIG. 4. Next, the potential of selected word line WL1 is pulled down to ground potential GND, whereby access transistor 1 of memory cell MC1 is rendered non-conductive. Current flow through a path from first power supply potential node 4 towards second power supply potential node 6 via load element 3. The potential of storage node 2 attains the level of potential $V_B$ at point B which is the crossing between straight line β and curve α in FIG. 4 to attain a stable state.

Thus, data "0" (L level) is written into memory cell MC1. Thereafter, current consumption is reduced to hold data "0" stably as shown in the L level hold period 1 in the waveform diagram of FIG. 5.

Next, the case is described in which data "0" is stored in memory cell MC1 (L level, where the potential of storage node 2 attains the level of $V_B$ at point B in FIG. 4 in a stable state (holding state)), and data "1" is written into memory cell MC1 (H level, where the potential of storage node 2 attains the level of potential $V_A$ at point A in FIG. 4 in a stable state (holding state)). (Refer to L→H writing period in the waveform diagram of FIG. 5).

When memory cell MC1 is selected, word line WL1 is driven to an H level (first potential $V_{CC}$) by row address buffer XAB, row address decoder XAD, and word line driver WD. Here, word line WL2 attains an L level (second potential: ground potential GND) since it is not selected. Access transistor 1 in respective memory cells. MC3 and MC4 connected to word line WL2 maintains a non-conductive state. Therefore, respective storage nodes 2 in memory cells MC3 and MC4 are not connected to bit lines BL1 and BL2, whereby data is continuously stored impervious to any effect.

When word line WL1 attains an H level, access transistor 1 of memory cell MC1 is rendered conductive, whereby storage node 2 is connected to bit line BL1, and also to first potential supply node 4 via bit line load transistor Q1. Since the resistance value of load element 3 is very high, and the difference between first potential $V_{CC}$ and threshold voltage $V_{th}$ (B) of bit line load transistor Q1 is smaller than switching initiate voltage $V_0$ of negative resistance element 5, current flows through a path of first power supply potential node 4, bit line load transistor Q1, bit line BL1 and access transistor 1. The potential of storage node 2 attains the level of potential $V_D$ at point D which is the crossing between curve $\gamma_R$ and curve α of FIG. 4.

Write driver WD includes a CMOS inverter having a P type MOS transistor and an N type MOS transistor connected in series at an output stage. The CMOS inverter receives a read/write signal from read/write buffer RWD to be activated, whereby a potential corresponding to data "1" (ground potential GND) applied via input/output buffer IOB is applied to data line DL. Then bit line BL1 is selected by column address buffer YAB, column address decoder YAD, and column select switch YS, whereby bit line BL1 is electrically connected to data line DL. The potential of bit line BL1 is pulled down towards the level of ground potential GND by write driver WD. As a result, the potential of storage node 2 in memory cell MC1 attains a level of potential VF (substantially equal to ground potential GND) at point F which is the crossing between straight line γWH and curve α in FIG. 4.

Here, access transistor 1 in memory cell MC2 connected to selected word line WL1 is also rendered conductive, whereby storage node 2 and bit line BL2 are electrically connected. However, bit line BL2 is not electrically connected to data line DL. Although a current flows to storage node 2 from source power supply potential node 4 via bit line load transistor Q2, data in memory cell MC2 will not be inverted. When data of an L level is stored in memory cell MC2, the potential of storage node 2 attains the level of potential $V_C$ at point C which is the crossing between curve $\gamma_R$ and curve α of FIG. 4. When data of an H level is stored in memory cell MC2, the potential of storage node 2 attains the level of potential $V_D$ at point D which is the crossing between curve $\gamma_R$ and curve $\alpha$ of FIG. 4. Data in memory cell MC2 will not be inverted since the difference between first potential $V_{CC}$ and threshold voltage Vth (B) of bit line load transistor Q2 is lower than switching initiate voltage $V_0$ of negative resistance element 5.

Then, selective bit line BL1 is electrically disconnected from data line DL. A current flow through a path of first power supply potential node 4, bit line load transistor Q1, bit line BL1 and access transistor 1. The potential of storage node 2 attains the level of potential $V_C$ at point C which is the crossing between curve $\gamma_R$ and curve $\alpha$ of FIG. 4. When the potential of selected word line WL1 is then driven to ground potential GND to render access transistor 1 of memory cell MC1 non-conductive, current flows through a path from first power supply potential node 4 to second power supply potential node 6 via load element 3. Therefore, the potential of storage node 2 attains the level of potential $V_A$ at point A which is the crossing between straight line $\beta$ and curve $\alpha$ of FIG. 4 to attain a stable state.

Thus, data "1" (H level) is written into memory cell MC1. Current consumption is reduced and maintain data "1" stably as shown at the H level hold period 2 in the waveform diagram of FIG. 5.

An operation of reading out data stored in memory cell MC1 will be described hereinafter.

It is assumed that data "0" is stored in memory cell MC1 (an L level, where the potential of storage node 2 attains the level of potential $V_B$ at point B in FIG. 4 in a stable state (holding state)). (Refer to L level readout period in the waveform diagram of FIG. 5).

When memory cell MC1 is selected, word line WL1 is driven to an H level (first potential $V_{CC}$) by row address buffer XAB, row address decoder XAD and word line driver WD. Here, word line WL2 attains an L level (second potential ground potential GND) since it is not selected. Access transistor 1 in memory cells MC1 and MC4 connected to word line WL2 maintains a non-conductive state. Therefore, respective storage nodes 2 in memory cells MC3 and MC4 are not connected to bit lines BL1 and BL2 to keep storing data.

When word line WL1 is pulled up to an H level, access transistor 1 of memory cell MC1 is rendered conductive, whereby storage node 2 is connected to bit line BL1, and also to first power supply potential node 4 via bit line load transistor Q1. Since the resistance value of load element 3 is extremely high, and the difference between first potential $V_{CC}$ and threshold voltage Vth (B) of bit line load transistor Q1 is lower than switching initiate voltage $V_0$ of negative resistance element 5, current flows through a path of first power supply potential node 4, bit line load transistor Q1, bit line BL1 and access transistor 1. The potential of storage node 2 attains the level of potential $V_D$ at point D which is the crossing between curve $\gamma_R$ and curve $\alpha$ of FIG. 4. Here, the current flowing through this path is current $I_D$ corresponding to point D.

This flow of current ID causes reduction in the potential of bit line BL charged to the potential level equal to the difference ($V_{CC}$ −Vth (B)) between first $V_{CC}$ and threshold voltage Vth (B) of bit line load transistor Q1 prior to conduction of access transistor 1.

Then, bit line BL1 is selected by column address buffer YAB, column address decoder YAD and column select switch YS to be electrically connected to data line DL. The potential of data line DL attains the level of $V_L$.

Sense amplifier SA activated in response to a read/write signal from read/write buffer RWS compares potential $V_L$ appearing on readout data line DR with comparison potential $V_R$ from dummy cell DC to carry out a sense and amplify operation when potential $V_L$ is lower than comparison potential $V_R$. An output of an L level corresponding to data "0" (ground potential GND in the present embodiment) is provided to input/output buffer IOB, whereby data "0" is output from input/output buffer IOB.

Here, access transistor 1 of memory cell MC2 connected to selected word line WL1 is rendered conductive, whereby storage node 2 and bit line BL2 are electrically connected. Although current flows from first power supply potential node 4 to storage node 2 via bit line load transistor Q2, data in memory cell MC2 is not inverted. When data of an L level is stored in memory cell MC2, the potential of storage node 2 first attains the level of potential $V_C$ at point C which is the crossing between curve $\gamma_R$ and curve $\alpha$ in FIG. 4. When data of an H level is stored in memory cell MC2, the potential of storage node 2 first attains the level of potential $V_D$ at point D which is the crossing between curve $\gamma_R$ and curve $\alpha$ of FIG. 4. The data in memory cell MC will not be inverted since the difference between first potential $V_{CC}$ and the threshold voltage Vth (B) of bit line load transistor Q2 is lower than switching initiate voltage $V_0$ of negative resistance element 5.

Then, selected bit line BL1 is electrically disconnected from data line DL. When the potential of selected word line WL1 is driven to ground potential GND which is the second potential and access transistor 1 of memory cell MC1 is rendered non-conductive, current flows through a path from first power supply potential node 4 to second power supply potential node 6 via load element 3. The potential of storage node 2 attains the level of potential $V_B$ at point B which is the crossing between straight line $\beta$ and curve $\alpha$ of FIG. 4 to attain a stable state.

Thus, data "0" (L level) stored in memory cell MC1 is read out. Current consumption is reduced to continue the storage of data "0" stably as shown in the L level holding period 2 in the waveform diagram of FIG. 5 thereafter.

Next, a case is described in which data "1" is stored in memory cell MC1 (H level, where the potential of storage node 2 in a stable state holding state) attains potential $V_A$ at point A in FIG. 4). (Refer to H level readout period in the waveform diagram of FIG. 5.)

When memory cell MC1 is selected, word line WL1 is driven to an H level (first potential $V_{CC}$) by row address buffer XAB, row address decoder XAD, and word line driver WD. Here, word line WL2 attains an L level (second potential: ground potential GND) since it is not selected. Access transistor 1 in memory cells MC3 and MC4 connected to word line WL2 maintains a non-conductive state. Therefore, respective storage nodes 2 in memory cells MC3 and MC4 are not connected in bit lines BL1 and BL2 to continue storing the data without being influenced.

When word line WL1 attains an H level, access transistor 1 in memory cell MC1 is rendered conductive, whereby storage node 2 is connected to bit line BL1, and also to first power supply potential node 4 via bit line load transistor Q1. Since the resistance of load element 3 is extremely high, and the difference ($V_{CC}$−Vth (B)) between first potential $V_{CC}$ and threshold voltage Vth (B) of bit line load transistor Q1 is lower than switching initiate voltage $V_0$ of negative resistance element 5, a current flows through a path of first power supply potential node 4, bit line load transistor Q1, bit line BL1 and access transistor 1. Therefore, the potential of storage node 2 attains the level of potential $V_C$ at point C which is the crossing between curve $\gamma_R$ and curve $\alpha$ of FIG.

4. Here, the current flowing through the above-described path is an extremely low current $I_C$ corresponding to point D.

The flow of this small current $I_C$ causes only a slight reduction in the potential of bit line BL charged to a potential equal to the difference ($V_{CC}$–Vth (B)) between first potential $V_{CC}$ and threshold voltage (Vth (B)) of bit line load transistor Q1 prior to conduction of access transistor 1.

Bit line BL1 is selected by column address buffer YAB, column address decoder YAD, and column select switch YS to be electrically connected to data bit line BL, whereby the potential of data line DR attains the level of potential VH which is substantially equal to the potential of the difference ($V_{CC}$–Vth (B)) between first potential $V_{CC}$ and threshold voltage Vth (B) of bit line load transistor Q1.

Sense amplifier SA activated in response to a read/write signal from read/write buffer RWS compares potential $V_H$ appearing on data line DL with a comparison potential VR from the dummy cell DC. Sense amplifier SA carries out a sense and amplify operation when potential $V_H$ is higher than comparison potential $V_R$. An output of an H level corresponding to data "1" (power supply potential $V_{CC}$ in the present embodiment) is provided to input/output buffer IOB. Data "1" is provided to the outside world via input/output buffer IOB.

Here, access transistor 1 in memory cell MC2 connected to selected word line WL1 is also rendered conductive, whereby storage node 2 and bit line BL2 are electrically connected. Although current flows from first power supply potential node 4 to storage node 2 via bit line load transistor Q2, data in memory cell MC2 is not inverted. More specifically, when data of an L level is stored in memory cell MC2, the potential of storage node 2 temporarily attains the level of potential $V_C$ at point C which is the crossing between curve $\gamma_R$ and curve $\alpha$ in FIG. 4. When data of an H level is stored in memory cell MC2, the potential of storage node 2 attains the level of potential $V_D$ at point D which is the crossing between curve $\gamma_R$ and curve $\alpha$ of FIG. 4. Data in memory cell MC2 will not be inverted since the difference between first potential $V_{CC}$ and threshold voltage Vth (B) of bit line load transistor Q2 is lower than switching initiate voltage $V_0$ of negative resistance element 5.

Then, selected bit line BL1 is electrically disconnected from data line DL, whereby the potential of selected word line WL1 is driven to ground potential GND which is a second potential, and access transistor 1 of memory cell MC1 is rendered non-conductive. Current flows from through a path from first power supply potential node 4 to second power supply potential node 6 via load element 3. Therefore, the potential of storage node 2 attains the level of potential $V_A$ at point A which is the crossing between straight line β and curve α of FIG. 4 to attain a stable state.

Thus, data "1" (H level) stored in memory cell MC1 is read out. Current consumption is reduced to continue storing data "1" stably as is shown in the H level hold period 2 in the waveform diagram of FIG. 5.

In an SRAM of the above-described structure, switching initiate voltage $V_0$ of negative resistance element 5 is set to a value greater than the difference between first potential $V_{CC}$ and threshold voltage Vth (B) of bit line load transistor Q2, and smaller than the difference between first potential $V_{CC}$ and threshold voltage Vth (A) of access transistor 1. With a supply of a first potential $V_{CC}$ and a second potential of a ground potential GND as a power supply system, i.e. with a single power source, data can be written into a selected memory cell in accuracy without damaging the data in a non-selected memory cell MC. Also, data can be read out accurately from a selected memory cell MC. Data held in a memory cell MC can be retained at a low power consumption.

Furthermore, switching initiate voltage $V_0$ of negative resistance element 5 is set to a value greater than ½ first potential $V_{CC}$. Therefore, the margin is increased due to two crossing points A and B with straight line β. Thus, data "0" and "1" can be reliably stored and retained even if there is a slight variation in the film thickness of tunnel insulation film 20 in negative resistance element 5 and in the impurity concentration and depth of P type semiconductor region 18 in the manufacturing process.

P type semiconductor region 18 of negative resistance element 5 has a depth of 0.05 μm–1 μm, and an impurity concentration of $1\times10^{17}/cm^3$ –$1\times10^{19}/cm^3$. Tunnel insulation film 20 of negative resistance element 5 is formed of a silicon oxide film of 25 Å–50 Å in thickness, a silicon nitride film of 50 Å–70 Å in thickness, or a silicon nitride oxide film of 30 Å–60 Å in thickness. Therefore, stable operation is implemented in a range of the voltage across negative resistance element 5, i.e. a range of 1 V to 6 V of first potential $V_{CC}$. Thus, an SRAM is provided that operates with a single power source of low voltage in the range of 1 V–3 V of a first potential $V_{CC}$.

Since an MIS switching diode which is a negative resistance element 5 is formed on a main surface of a semiconductor substrate 1, the manufacturing process thereof can be carried out easily. Furthermore, complicated manufacturing steps are not required since the gate electrode of access transistor 1, electrode 21 of MIS switching diode 5, and load element 3 are formed of separate layers of a first conductor layer, a second conductor layer, and a third conductor layer, respectively.

Electrode 21 of MIS switching diode 5 has a thickness of more than 1500 Å. Therefore, there is no possibility of tunnel insulation film 20 being damage even if the surface of electrode 21 is etched away in forming a contact hole 22b in first interlayer insulation film 22 to obtain electrical contact with low resistance portion 23 of the third conductor layer. Increase in leakage current can be suppressed to obtain an MIS switching diode 5 of high performance.

Second Embodiment

Figure 6:
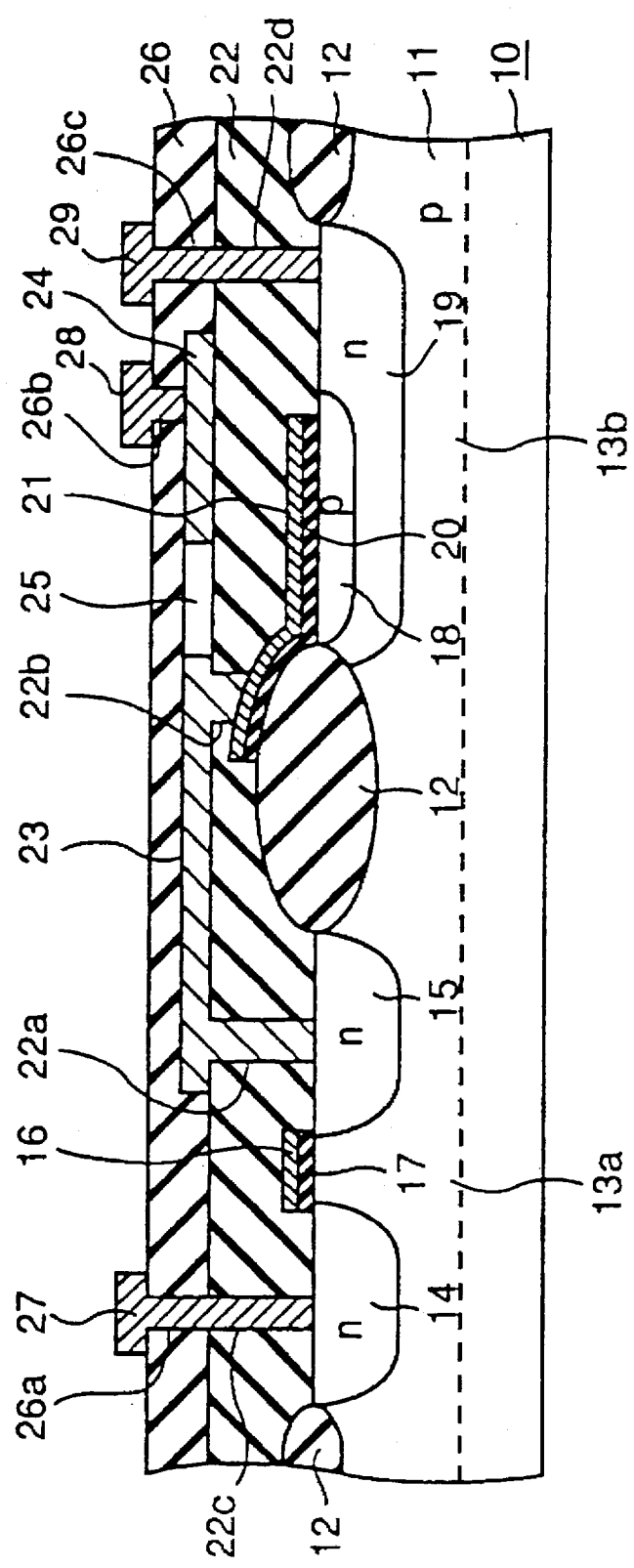
FIGS. 6–11 are sectional views showing a structure of a memory cell of an SRAM according to second-seventh embodiments, respectively, of the present invention.

FIG. 6 is a sectional view of a memory cell MC of an SRAM according to a second embodiment of the present invention. The SRAM of the second embodiment is similar to the SRAM of the first embodiment except for the structure of memory cell MC, particularly the structure of P type semiconductor region 18, tunnel insulation film 20 and electrode 21 of a MIS switching diode which is negative resistance element 5, and the connection between low resistance portion 23 of a third polysilicon layer and electrode 21.

Components in FIG. 6 corresponding to those shown in FIG. 3 of the first embodiment have the same reference characters allotted. P type semiconductor region 18 has a portion thereof formed in contact with a portion of isolation insulation film 12. In the second embodiment, isolation insulation film 12 is located between a first formation region 13a and a second formation region 13b. P type semiconductor region 18 has a depth of 0.05 μm–1 μm and an impurity concentration of $1\times10^{17}/cm - 1\times10^{19}/cm^3$.

Tunnel insulation film 20 is formed in contact with the exposed face of P type semiconductor region 18, and formed extending over isolation insulation film 12 from the contact portion of P type semiconductor region 18 and isolation insulation film 12 onto. Tunnel insulation film 20 is formed of any of a silicon oxide film of 25 Å–50 Å in thickness, a silicon nitride film of 50 Å–70 Å in thickness, or a silicon nitride oxide film of 30 Å–60 Å in thickness. Electrode 21 is formed of a second conductor layer (polysilicon layer) is provided on the surface of tunnel insulation film 20, and is electrically connected to storage node 2 shown in FIG. 2. Similar to tunnel insulation film 20, electrode 21 extends over isolation insulation film 12 from the connection of P type semiconductor region 18 and isolation insulation film 12. The thickness of electrode 21 is set to at least 1500 Å, for example, 2000 Å.

A pair of low resistance portions 23 and 24 of a third conductor layer (polysilicon layer) are formed upper than the second conductor layer and on a first interlayer insulation film 22. A high resistance portion 25 corresponding to load element 3 of FIG. 2 is provided between low resistance portions 23 and 24. One low resistance portion 23 is electrically connected to one source/drain region 15 of the pair of source/drain regions in access transistor 1 via a contact hole 22a in first interlayer insulation film 22, and to an extending portion on isolation insulation film 12 in electrode 21 of the MIS switching diode via a contact hole 22b formed in first interlayer insulation film 22 and above isolation insulation film 12. Low resistance portion 23 forms storage node 2. The other low resistance portion 24 is electrically connected to first power supply potential node 4 of FIG. 2.

Similar to the first embodiment, the SRAM including a memory cell MC of the above-described structure can read/write and hold data with similar advantages. Since electrode 21 of the MIS switching diode is electrically connected to low resistance portion 23 of load element 3 on isolation insulation film 12, there is absolutely no possibility of tunnel insulation film 20 of the MIS switching diode being damaged even if the surface of electrode 21 is damaged by the etching process in forming contact hole 22b in first interlayer insulation film 22. Reliability of tunnel insulation film 20 is improved, and leakage current is further suppressed.

Third Embodiment

Figure 7:
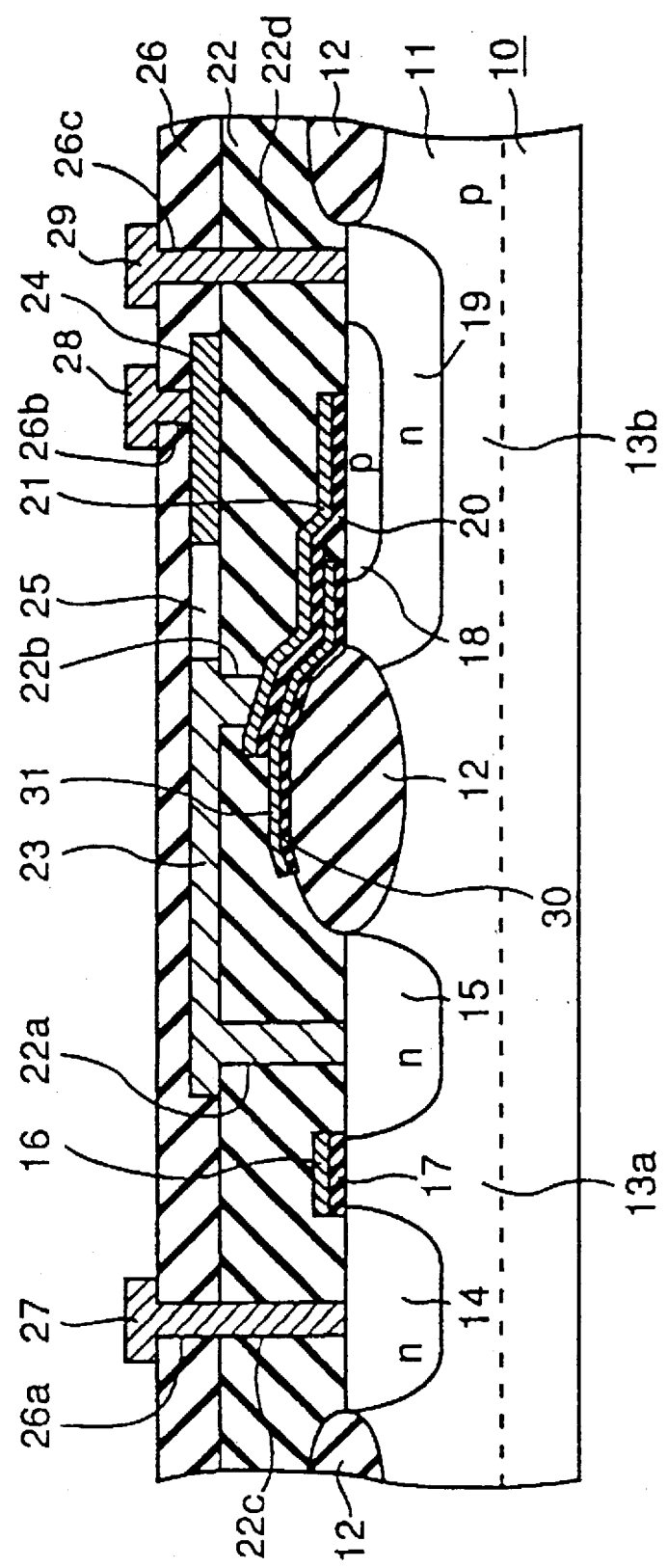

FIG. 7 is a sectional view showing a structure of a memory cell MC of an SRAM according to a third embodiment of the present invention. The SRAM of FIG. 7 is similar to the SRAM of the first embodiment except for the structure of memory cell MC, particularly the structure of P type semiconductor region 18, tunnel insulation film 20 and electrode 21 of the MIS switching diode which is negative resistance element 5, and the connection between low resistance portion 23 of a third polysilicon layer and electrode 21.

The components in FIG. 7 corresponding to those in FIG. 3 of the first embodiment have the same reference characters allotted. P type semiconductor region 18 has its circumference is completely surrounded by an N type semiconductor region 19. P type semiconductor region 18 has a depth of 0.05 μm–1 μm and an impurity concentration of $1 \times 10^{17}/cm^3$ –$1 \times 10^{19}/cm^3$.

Gate insulation film 17 forming access transistor 1 is formed concurrent with insulation film 30. Insulation film 30 is formed extending from a portion of the exposed face of P type semiconductor region 18, and over the exposed face of N type semiconductor region 19 between P type semiconductor region 18 and isolation insulation film 12 at the side of first formation region 13a to above that portion of isolation insulation film 12.

Simultaneous with gate electrode 16 of access transistor 1, a dummy layer 31 formed of a first conductor layer (polysilicon layer) is provided on the surface os insulation film 30. Similar to insulation film 30, dummy layer 31 extends from a portion of the exposed face of P type semiconductor region 18, and over the exposed face of N type semiconductor region 19 between P type semiconductor region 18 and isolation insulation film 12 at the side of first formation region 13a, to that portion of isolation insulation film 12.

Tunnel insulation film 20 is formed in contact with the exposed face of P type semiconductor region 18 in second formation region 13b, and extends over isolation insulation film 12 at the side of first formation region 13a in contact with the surface of dummy layer 31. Tunnel insulation film 20 is formed of any of a silicon oxide film of 25 Å–50 Å in thickness, a silicon nitride film of 50 Å–70 Å in thickness, or a silicon nitride oxide film of 30 Å–60 Å in thickness. Electrode 21 is formed of a second conductor layer (polysilicon layer) on the surface of tunnel insulation film 20, and is electrically connected to storage node 2 of FIG. 2. Similar to tunnel insulation film 20, electrode 21 is formed extending over isolation insulation film 12 located at the side of first formation region 13a. The thickness of electrode 21 is set to at least 1500 Å, for example, 20000 Å.

A pair of low resistance portions 23 and 24 formed of a third conductor layer (polysilicon layer) upper than the second layer is provided on first interlayer insulation film 22. A high resistance portion 25 corresponding to load element 3 is formed. One low resistance portion 23 is electrically connected to one source/drain region 15 of access transistor 1 via contact hole 22a provided in first interlayer insulation film 22, and also to a portion of electrode 21 extending over isolation insulation film 12 via contact hole 22b formed on isolation insulation film 12 in interlayer insulation film 22. Low resistance portion 23 forms storage node 2 of FIG. 2. The other low resistance portion 24 is electrically connected to first power supply potential node 4 of FIG. 2.

Similar to the first embodiment, the SRAM having a memory cell MC of the above-described structure allows data to be written/read and retained to achieve similar advantages. Since P type semiconductor region 18 is not brought into contact with isolation oxide film 12 due to the presence of N type semiconductor region 19 around P type semiconductor region 18, leakage current caused by crystal deficiency due to difference in the crystal structure between P type semiconductor region 18 and isolation oxide film 12 can be suppressed. Furthermore, damage towards tunnel insulation film 20 of the MIS switching diode can be completely obviated due to the electrical connection between electrode 21 and low resistance portion 23 of load element 3 on isolation insulation film 12. Therefore, reliability of tunnel insulation film 20 can be improved to further reduced leakage current.

Fourth Embodiment

Figure 8:
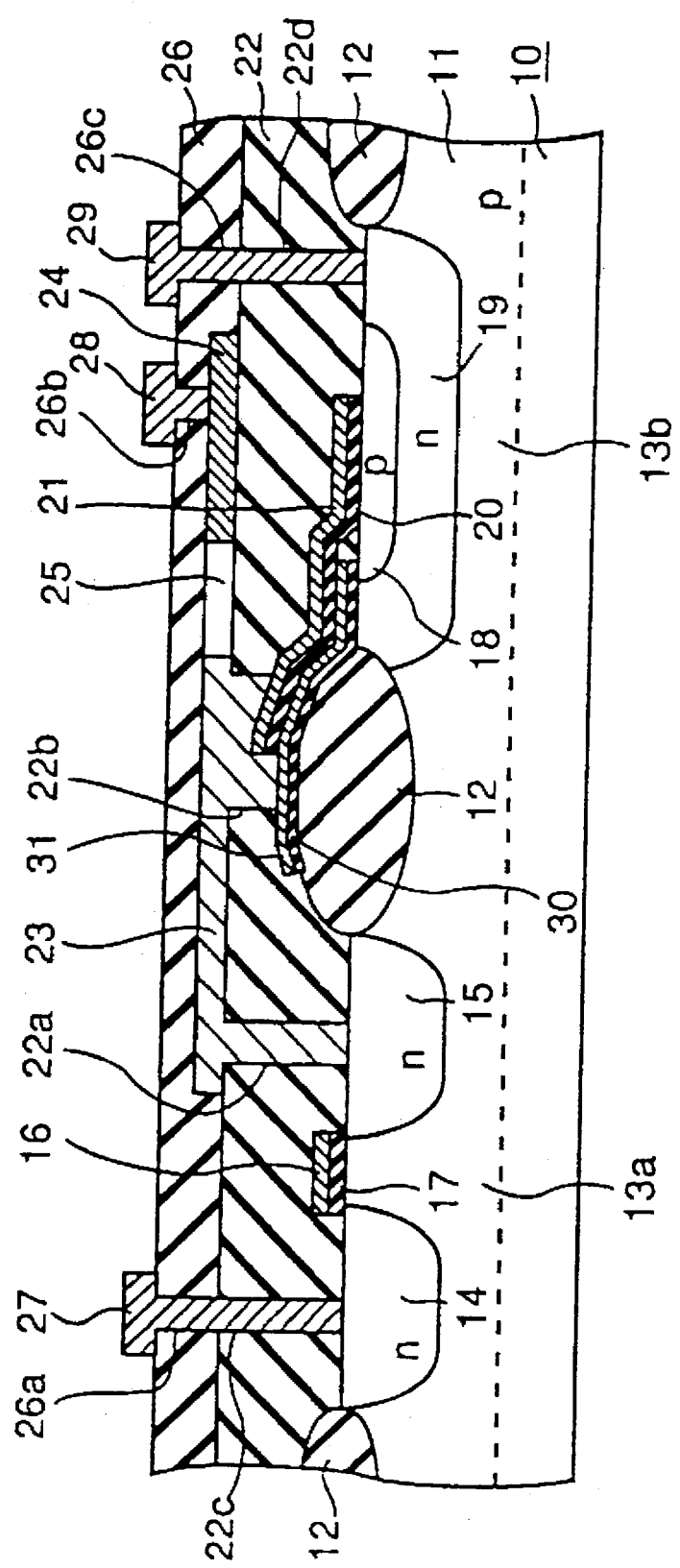

FIG. 8 is a sectional view showing a structure of a memory cell MC of an SRAM according to a fourth embodiment of the present invention. The SRAM of FIG. 8 is similar to that of the third embodiment except for the structure of memory cell MC, i.e. dummy layer 13 is also electrically connected to low resistance portion 23 of the third conductor layer.

Components of FIG. 3 corresponding to those of FIG. 7 of the third embodiment have the same reference characters allotted.

Similar to the third embodiment, the SRAM having a memory cell MC of the above-described structure allows data to be written/read and retained to achieve similar advantages. Furthermore, generation of noise by dummy layer 31 can be suppressed since dummy layer 31 is electrically connected to low resistance portion 23 of the third conductor layer above isolation insulation film 12.

Fifth Embodiment

Figure 9:
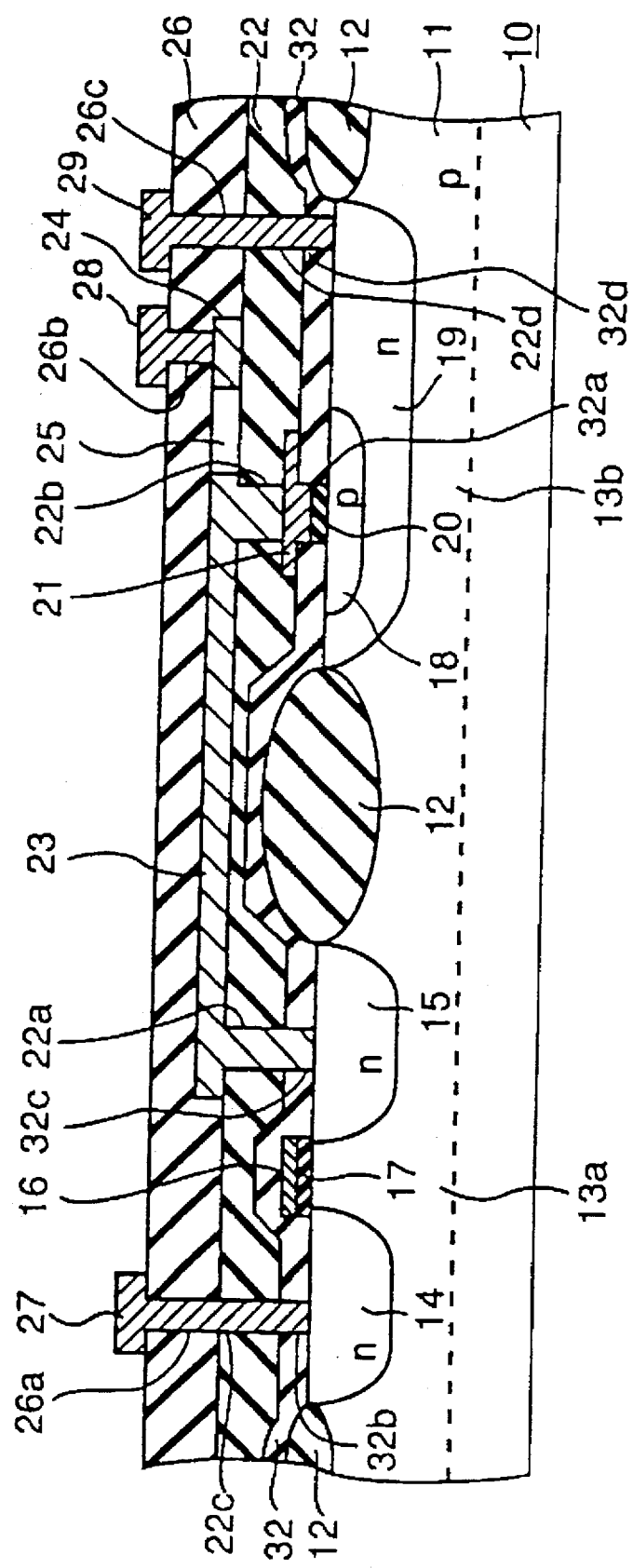

FIG. 9 is a sectional view showing a structure of a memory cell MC of an SRAM according to the fifth embodiment of the present invention. In the SRAM of FIG. 9, an interlayer insulation film 32 of sufficient thickness to prevent flow of a tunnel current is formed. A contact hole 32a is formed at an appropriate position on the surface of P type semiconductor region 18 in interlayer insulation film 32. Tunnel insulation film 20 is formed in contact hole 32a. A second conductor layer is formed on interlayer insulation film 32 and tunnel insulation film 20. The second conductor layer is etched to obtain electrode 21. This method differs from that of the first embodiment in which an insulation film for forming tunnel insulation film 20 and a second conductor layer for forming electrode 21 are sequentially provided, followed by an etching process of the insulation film and the second conductor layer to form tunnel insulation film 20 and electrode 21. The remaining elements of the fifth embodiment are similar to those of the first embodiment.

It is to be noted that contact holes 32b–32d are formed in interlayer insulation film 32. Bit line 27 is connected to one source/drain region 14 of access transistor 1, low resistance portion 23 is connected to the other source/drain region 15 in access transistor 1, and second power supply potential line 29 is connected to N type impurity region 19 of negative resistance element 5 via contact holes 32b, 32c, and 32d, respectively.

Tunnel insulation film 20 grown in contact hole 32a of interlayer insulation film 32 is similar to that of the first embodiment. More specifically, tunnel insulation film 20 is formed of any of a silicon oxide film of 25 Å–50 Å in thickness, a silicon nitride film of 50 Å–70 Å in thickness, or a silicon nitride oxide film of 30 Å–60 Å in film thickness.

Similar to the first embodiment, the semiconductor memory device having a memory cell MC of the above-described structure can read/write and retain data to achieve similar advantages. Since tunnel insulation film 20 is grown in contact hole 32a of interlayer insulation film 32, the occupying area of memory cell MC can be reduced.

Sixth Embodiment

Figure 10:
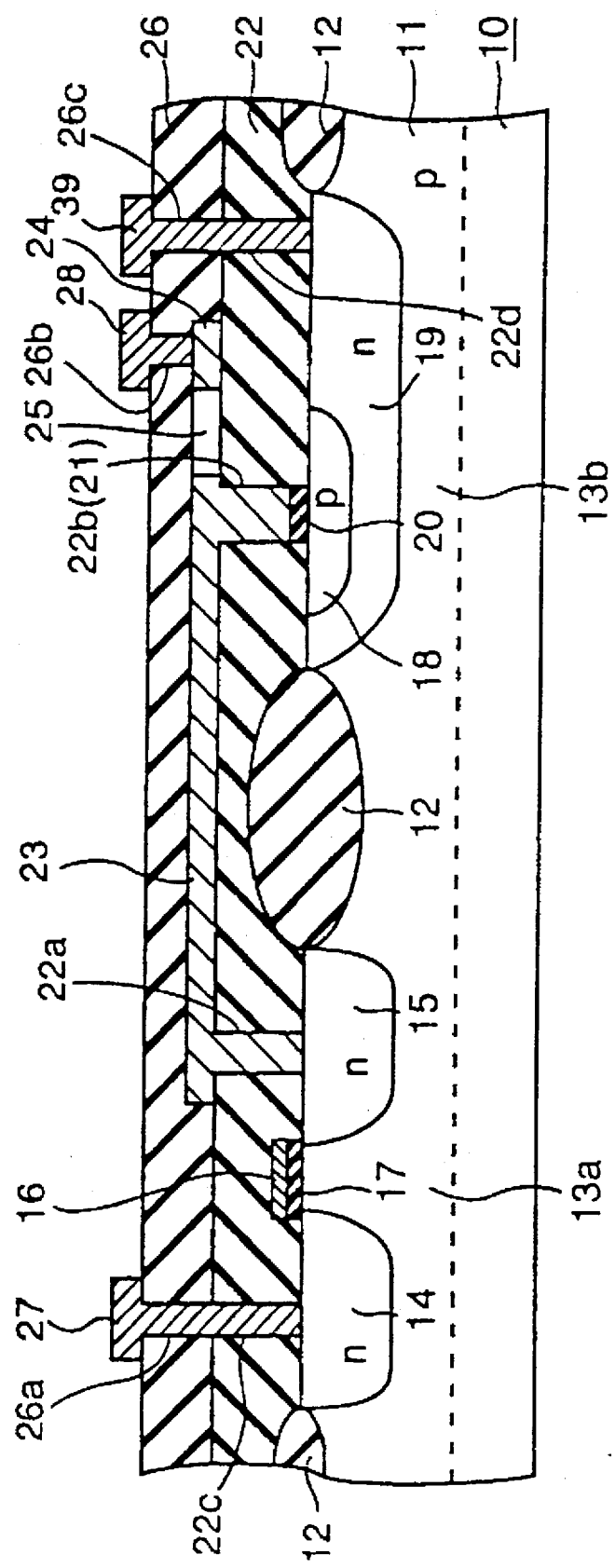

FIG. 10 is a sectional view showing a structure of a memory cell MC of an SRAM according to a sixth embodiment of the present invention. In the sixth embodiment, an interlayer insulation film 22 of a desired thickness is formed on the surface of a substrate 10. Contact hole 22b is formed at an appropriate position on the surface of P type semiconductor region 18 in interlayer insulation film 22. Tunnel insulation film 20 is grown in contact hole 22b. The second conductor layer is formed on interlayer insulation film 22 and tunnel insulation film 20. Electrode 21 of a second conductor layer is formed on tunnel insulation film 20. This method differs from that of the first embodiment in which tunnel insulation film 20 and electrode 21 are formed prior to the formation of interlayer insulation film 22. The remaining elements are similar to those of the first embodiment.

Similar to the first embodiment, the SRAM including a memory cell MC of such a structure can have data read/ written and retained to achieve similar advantages. Since tunnel insulation film 20 is grown in contact hole 22b in interlayer insulation film 22, the occupying area of memory cell MC can be reduced. Furthermore, the number of manufacturing steps can be reduced since the number of conductor layers can be reduced from three to two layers.

Seventh Embodiment

Figure 11:
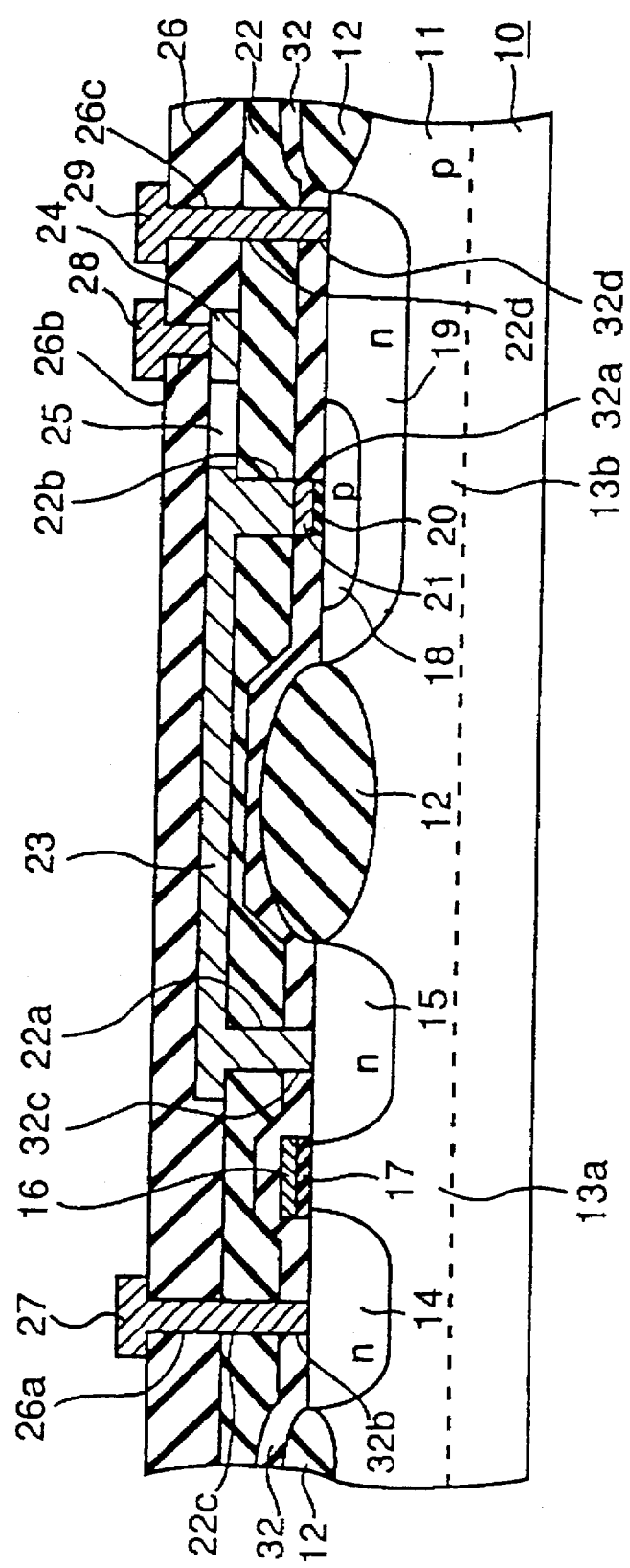

FIG. 11 is a sectional view showing a structure of a memory cell MC of an SRAM according to a seventh embodiment of the present invention. In the previous fifth embodiment, the second conductor layer is formed on interlayer insulation film 32 and tunnel insulation film 20 after tunnel insulation film 20 is grown in contact hole 32a, followed by an etching process of the second conductor layer to obtain electrode 21. In contrast, the SRAM of the seventh embodiment has electrode 21 formed of a second conductor layer buried in contact hole 32a. The remaining elements are similar to those of the fifth embodiment.

Similar to the first embodiment, the SRAM including a memory cell MC of such a structure can have data written/ read and retained to achieve the same advantages. Since tunnel insulation film 20 is grown in contact hole 22b in interlayer insulation film 22, the occupying area of memory cell MC can be reduced. Furthermore, the provision of electrode 21 of a second conductor layer within contact hole 32a in interlayer insulation film 32 provides the advantage of increase in focus margin in a photolithography step subsequent to formation of electrode 21 due to reduction in a step portion by the second conductor layer.

Eighth Embodiment

Figure 12:
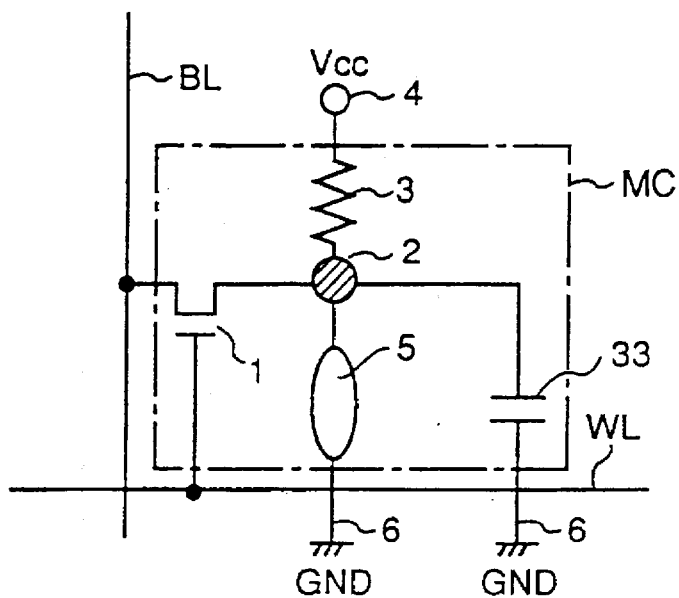
FIGS. 12 and 13 are equivalent circuit diagrams of a memory cell according to eighth and ninth embodiments, respectively, of the present invention.

FIG. 12 is a circuit diagram showing a memory cell MC of an SRAM according to an eighth embodiment of the present invention. Referring to FIG. 12, memory cell MC of the SRAM of the eighth embodiment is formed of four elements, including a capacitive element 33 connected between storage node 2 and a second power supply node to which a second potential (ground potential GND) is applied, as well as the three elements of access transistor 1, load element 3 and negative resistance element 5. The SRAM is similar to that of the first embodiment provided that the operation of data readout differs due to the 4-element structure.

Difference in a readout operation from that of the first embodiment is set forth in the following. In a state before memory cell MC is selected, the potential of bit line BL attains an electrically floating state. When memory cell MC is selected and storage node 2 is connected to bit line BL, mobility in charge occurs so that the charge based on data held by capacitive element 33 is equal in potential to the charge applied to the bit line. Therefore, the amount of charge movement differs depending upon whether the data held in memory cell MC is "0" or "1". Data is read out taking advantage of the difference in the bit line potential after this mobility of charge.

Similar to the first embodiment, the SRAM including a memory cell of such a structure can write and retain data to achieve the same advantage. In a data read out operation, a great amount of current will not be conducted into negative resistance element 5 to prevent reduction in reliability caused by a current flow to tunnel oxide film 20.

Ninth Embodiment

Figure 13:
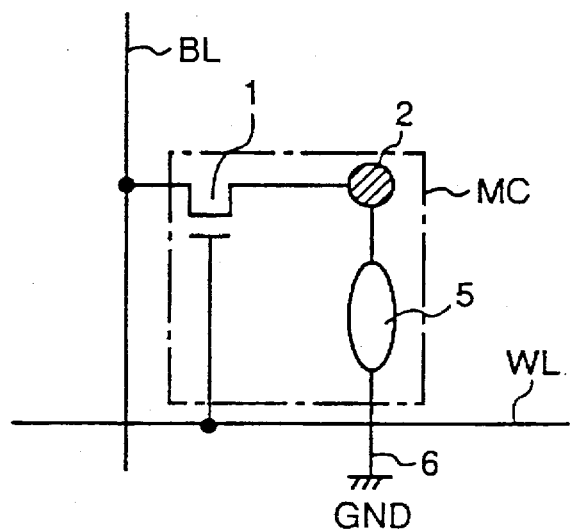
Figure 14:
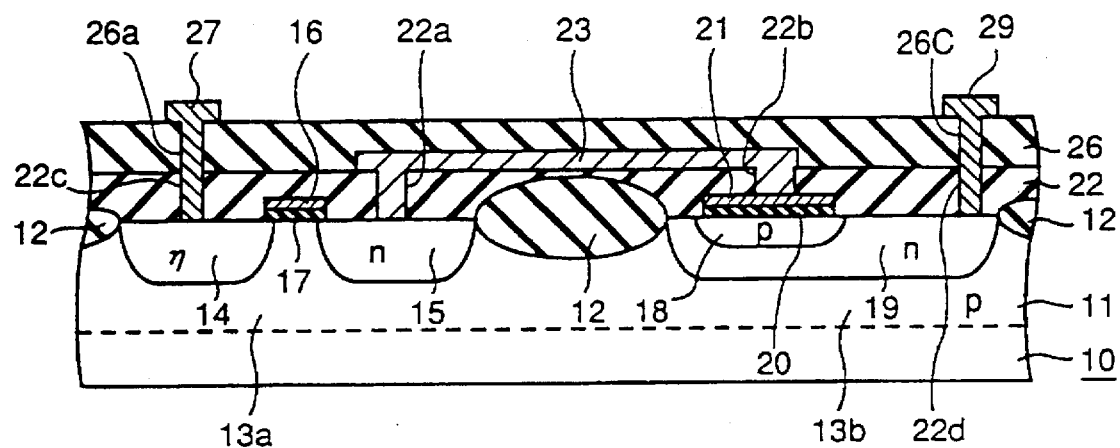
FIG. 14 is a sectional view of the memory cell of FIG. 13.

FIGS. 13 and 14 are a circuit diagram and a sectional view, respectively, of a memory cell MC of an SRAM according to a ninth embodiment of the present invention. In contrast to the first embodiment in which memory cell MC is formed of three elements of access transistor 1, load element 3, and negative resistance element 5, memory cell MC of the ninth embodiment is formed of two elements including access transistor 1 and negative resistance element 5. The ninth embodiment is similar to the first embodiment provided that the structure associated with the 2-element structure differs. The remaining elements are similar to those of the first embodiment.

Components shown in FIGS. 13 and 14 corresponding to those shown in FIGS. 2 and 3 of the first embodiment have the same reference characters allotted. Access transistor 1 formed of an N channel MOS transistor has a drain electrode connected to bit line BL of the corresponding column, a source electrode connected to storage node 2, and a gate electrode connected to word line WL of a corresponding row. Threshold voltage Vth (A) of access transistor 1 is set lower than threshold voltage Vth (B) of bit line load transistors Q1 and Q2. When access transistor 11 has ground potential GND applied to the gate electrode, a subthreshold current is applied to storage node 2 according to power supplied to the drain region from first power supply potential node 4 via first bit line load transistors Q1 and Q2 and bit line BL. The level of this subthreshold current is desirably similar to the current flowing to load element 3 in the first embodiment.

During a non-selected state of a memory cell and a data holding period in the SRAM of the ninth embodiment, subthreshold current of access transistor 1 according to the power from first bit line load transistors Q1 and Q2 and bit line BL flow to negative resistance element 5 from a first power supply potential node 4, i.e. the voltage-current characteristics β shown in FIG. 4 is obtained by access transistor 1. Therefore, an operation and advantage similar to those of the first embodiment can be obtained. Furthermore, the occupying area can be reduced, and the manufacturing step simplified since memory cell MC is formed of 2 elements.

Tenth Embodiment

Figure 15:
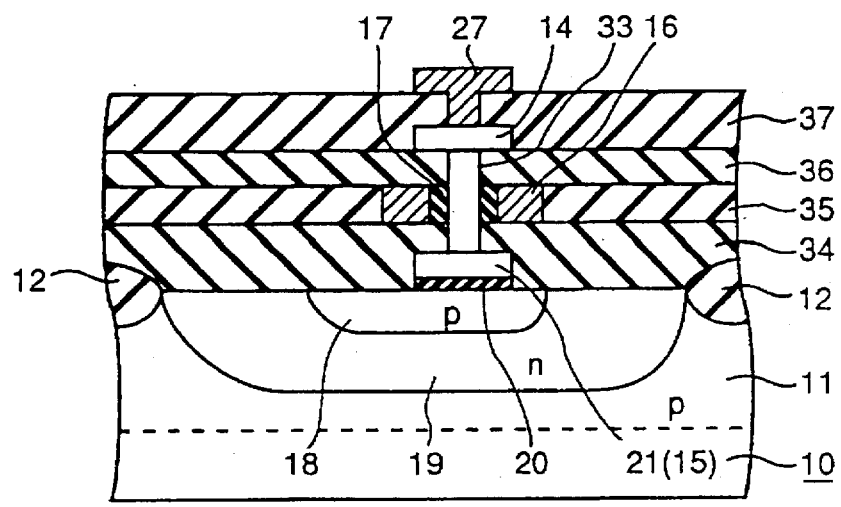
FIG. 15 is a sectional view of a memory cell of an SRAM according to a tenth embodiment of the present invention.

FIG. 15 is a sectional view showing a structure of the memory cell MC of an SRAM of the tenth embodiment. In contrast to the ninth embodiment in which access transistor 1 is formed of a planar type N channel MOS transistor, access transistor 1 of the memory cell of the tenth embodiment is formed of a contact hole type transistor. The remaining elements are similar to those of the ninth embodiment.

Components in FIG. 15 corresponding to those of FIG. 14 have the same reference characters allotted. Electrode 21 formed of a second conductor layer of polysilicon into which N type impurities are implanted is provided on the surface of tunnel insulation film 20. Electrode 21 also serves as the other source/drain region 15 of access transistor 1.

A channel region 33 is provided in the contact hole through interlayer insulation films 34, 35 and 36 on the surface of electrode 21, and is formed of polysilicon doped with P type impurities. Channel region 33 forms a PN junction with electrode 21. Gate electrode 16 of a polysilicon layer is formed so as to surround the circumference of channel region 33 with gate insulation film 17 therebetween. One source/drain region 14 of polysilicon doped with N type impurities is formed on interlayer insulation film 36. Source/drain region 14 forms a PN junction with channel region 31.

Access transistor 1 is formed of the other source/drain region 15, channel region 33, gate electrode 16, and one source/drain region 14.

Bit line 27 is formed on interlayer insulation film 37. Bit line 27 is electrically connected to source/drain region 14 via a contact hole formed in interlayer insulation film 37.

Similar to the ninth embodiment, the SRAM including a memory cell MC of such a structure achieves similar advantages. Since access transistor 1 is formed on switching diode, the occupying area of memory cell MC can further be reduced.

Eleventh Embodiment

Figure 16:
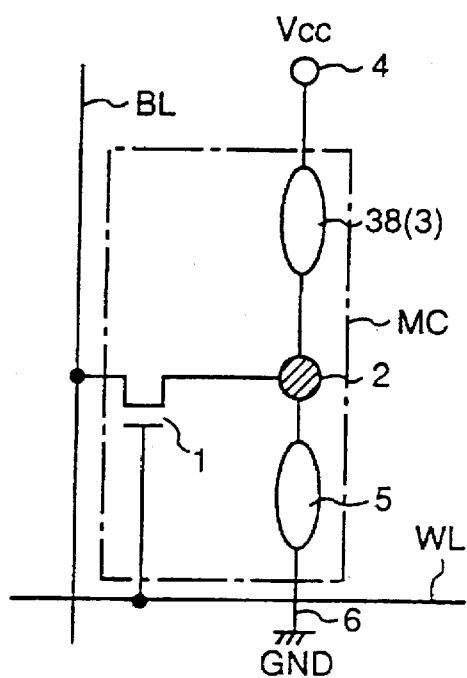
FIG. 16 is an equivalent circuit diagram of a memory cell of an SRAM according to an eleventh embodiment of the present invention.

FIG. 16 is a circuit diagram showing a structure of a memory cell MC of an SRAM according to an eleventh embodiment of the present invention. In contrast to the first embodiment in which load element 3 is formed of a resistance element of high resistance, memory cell MC of the eleventh embodiment has load element 3 connected between first power supply potential node 4 and storage node 2 formed of a negative resistance element 38. The SRAM shown in FIG. 16 is similar to the SRAM of the first embodiment provided that the structure of components associated with this structure differs.

Figure 17:
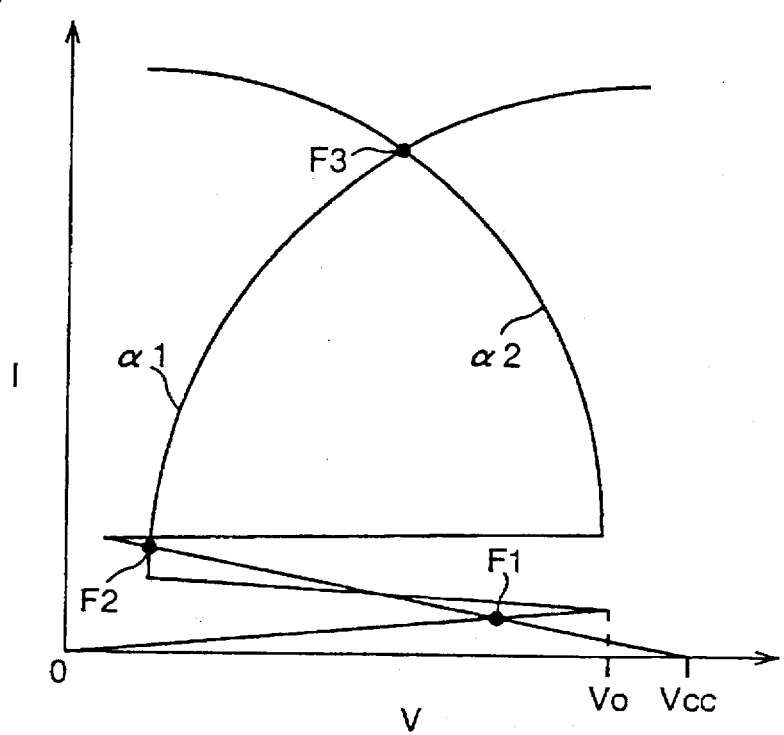
FIG. 17 is a current-voltage characteristic diagram of two negative resistance elements in the memory cell of FIG. 16.

FIG. 17 shows the current-voltage characteristics of a memory cell MC formed as described above. Referring to FIG. 17, a curve $\alpha_1$ in a bold solid line represents the current-voltage characteristics (negative resistance characteristic) of negative resistance element 5. A curve $\alpha_2$ in a thin solid line represents the current-voltage characteristics (negative resistance characteristic) of negative resistance element 38. Points F1–F3 are the crossing points between curves $\alpha_1$ and $\alpha_2$, which are the stable points in a data holding state.

Similar to the first embodiment, the semiconductor memory device including a memory cell MC of the above structure can have data written/read and retained to achieve similar advantages. Furthermore, multi-bit storage is allowed due to the presence of three stable points.

Twelfth Embodiment

Figure 18:
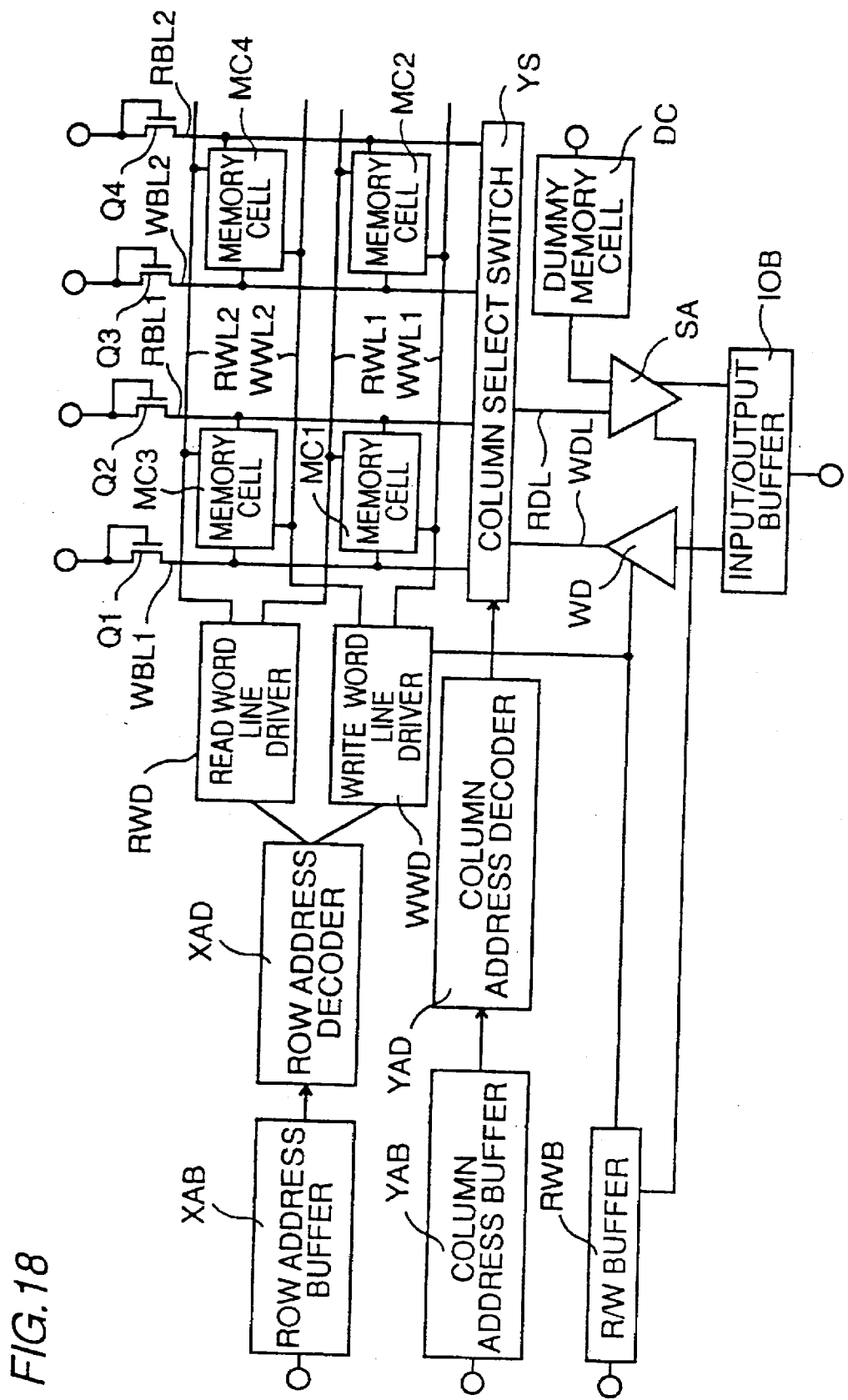
FIG. 18 is a circuit block diagram showing a structure of an SRAM according to a twelfth embodiment of the present invention.

FIG. 18 is a block diagram showing a structure of an SRAM according to a twelfth embodiment of the present invention. Referring to FIG. 18, the SRAM includes a plurality of memory cells MC1–MC4 disposed at respective ones of a plurality of rows and columns (for the sake of convenience, only two rows and two columns are illustrated). Each of memory cells MC–MC4 is connected to a write word line WWL and a read word line RWL disposed in a corresponding row, and also to write bit line WBL and read bit line RDL disposed in a corresponding column.

More specifically, write word lines WWL1 and WWL2 are disposed at respective corresponding ones of a plurality of rows. Read word lines RWL1 and RWL2 are disposed at respective corresponding ones of a plurality of rows. Write bit lines WBL1 and WBL2 are disposed at respective corresponding ones of a plurality of columns. Read bit lines RBL1 and RBL2 are disposed at respective corresponding ones of a plurality of columns. Each one line of write word lines WWL1 and WWL2 and read word lines RWL1 and RWL2 form a pair to be respectively connected to memory cells MC1 and MC2 or memory cells MC3 and MC4, respectively, of a corresponding row. Each one of write bit lines WBL1 and WBL2 and read bit lines RBL1 and RBL2 form a pair to be respectively connected to memory cells MC1 and MC3 or memory cells MC2 and MC4 of a corresponding columns.

Bit line load transistors Q1 and Q3 are provided corresponding to a plurality of write bit lines WBL1 and WBL2, respectively. Each of bit line load transistors Q1 and Q3 is formed of an N type MOS transistor connected between a first power supply potential node to which a first power supply potential $V_{CC}$ is supplied and a corresponding bit line WBL. Bit line load, transistors Q2 and Q4 are provided corresponding to a plurality of read bit lines RWBL1 and RWBL2. Each of bit line load transistors Q2 and Q4 is formed of an N channel MOS transistor connected between the first power supply potential node and a corresponding bit line RBL.

Figure 19:
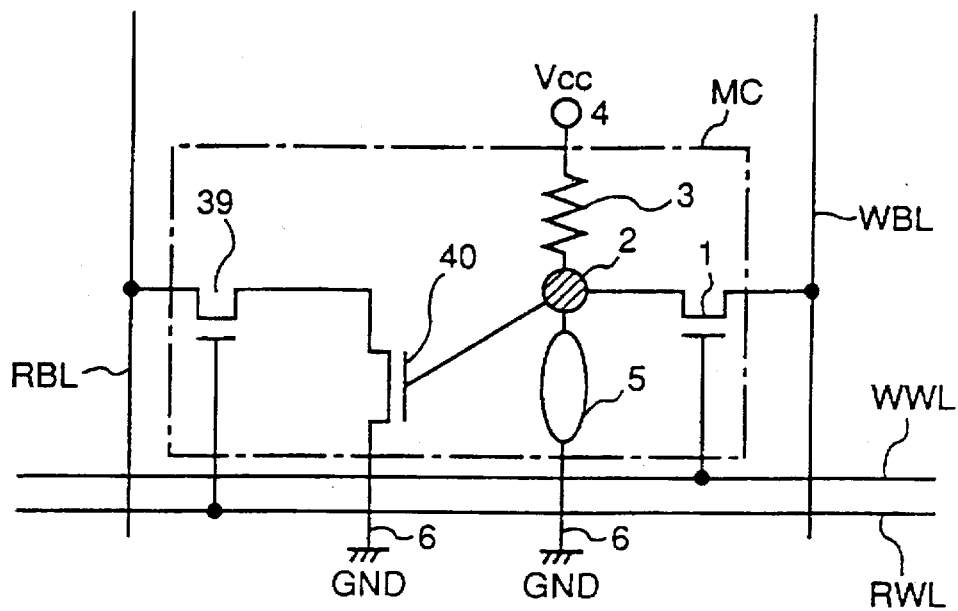
FIG. 19 is an equivalent circuit diagram of the memory cell of FIG. 18.

FIG. 19 is a circuit diagram showing a structure of a memory cell MC of this SRAM. Referring to FIG. 19, memory cell MC includes a write access transistor 1 formed of an N channel MOS transistor, a load element 3 formed of a resistance element of high resistance, and a negative resistance element 5 formed of an MIS switching diode. Write access transistor 1 has a drain electrode connected to write bit line WBL of a corresponding column, a source electrode connected to storage node 2, and a gate electrode connected to write word line WWL of a corresponding row. Write access transistor 1 has threshold voltage Vth (A) set smaller than threshold voltage Vth (B) of bit line load transistors Q1 and Q3. Load element 3 is connected between first power supply potential node 4 to which first power supply potential $V_{CC}$ is supplied and storage node 2. Negative resistance element 5 is connected between storage node 2 and a second power supply potential node 6 to which a second potential (ground potential GND) is supplied. Switching initiate voltage $V_0$ of negative resistance element 5 is set to a value greater than the difference between first power supply potential $V_{CC}$ and threshold voltage Vth (B) of bit line load transistors Q1 and Q3, and smaller than the difference between first potential $V_{CC}$ and threshold voltage Vth (A) of access transistor 1, and greater than ½ the first potential $V_{CC}$.

Memory cell MC of the present embodiment includes a read access transistor 39 formed of an N channel MOS transistor, and a read transistor 40 formed of an N channel MOS transistor. Read access transistor 39 has a drain electrode connected to read bit line RBL of a corresponding column, and a gate electrode connected to read word line RWL of a corresponding row. Read transistor 40 is connected between a source electrode of read access transistor 39 and a third power supply potential node 6 to which a third potential, ground potential GND in the present embodiment, is supplied. The gate electrode of read transistor 40 is connected to storage node 2.

The SRAM of the present embodiment includes a row address buffer XAB, a column address decoder XAD, and a read word line driver RWD. Referring to FIG. 18, row address buffer XAB receives an externally applied row address signal for providing an internal row address signal. Row address decoder XAD receives an internal row address signal from row address buffer XAB for providing a row decode signal to select one of a plurality of word line pairs formed of one write word line WWL and read word line RWL. Read word line driver RWD receives a row decode signal from row address decoder XAD to provide first potential $V_{CC}$ to internal read word line RWL of a word line pair selected according to the received row decode signal, and maintains read word line RWL that is not selected at a second potential (ground potential GND).

The SRAM includes a read/write buffer RWB, and a write word line driver WWD. Read/write buffer RWB receives an externally applied read/write signal to provide an internal read/write signal. Write word line driver WWD receives a row decode signal from row address decoder XAD and an internal read/write signal from read/write buffer RWB. When the received internal read/write signal indicates a writing operation (L level in the present twelfth embodiment), first potential $V_{CC}$ is applied to internal write word line WWL of a word line pair selected according to the received row decode signal. Write word line WWL that is not selected is maintained at the level of the second potential (ground potential GND). When the received internal read/write signal indicates a read out operation (H level in the present twelfth embodiment), write word line driver WWD sets all write word lines WWL to a non-selected state.

The SRAM further includes a column address buffer YAB, a column address decoder YAD, and a column select switch YS. Column address buffer YAB receives an externally applied column address signal to provide an internal column address signal. Column address decoder YAD receives an internal column address signal from column address buffer YAB to select any one of a plurality of bit line pairs, each pair formed of one write bit line WBL and one read bit line RBL. Column select switch YS receives a column decode signal from column address decoder YAD to connect internal write bit line WBL in a bit line pair selected according to the received decode signal to write data line WDL, and read out bit line RBL to read data line RDL. Column select switch YS maintains the disconnected state of non-selected bit line BL pair from write data line WBL and read data line RDL.

The SRAM includes a write driver WD forming a write circuit, a sense amplifier SA forming a readout circuit, a dummy cell DC forming a comparison potential generation circuit, and an input/output buffer IOB. Write driver WD receives an internal read/write signal from read/write buffer RWB to be rendered active when the received internal read/write signal indicates a writing operation (H level in the present twelfth embodiment) to provide data according to the input write data onto write data line WDL. Write driver WD includes an CMOS inverter in which a P type MOS transistor and an N type MOS transistor are connected in series at an output stage. According to this CMOS inverter, data is applied to write data line WDL so that selected write bit line WBL indicates a potential identical to first potential $V_{CC}$ and so that selected write bit line WBL indicates a potential identical to the second potential (ground potential GND), when the input write data indicates "0" and "1", respectively.

Sense amplifier SA receives an internal read/write signal from read/write buffer RWB to be rendered active, when the received internal read/write signal indicates a readout operation (an H level in the twelfth embodiment) to compare a potential appearing on read data line RDL based upon data read out from selected memory cell MC and comparison potential $V_R$ to provide readout data. More specifically, sense amplifier SA provides an output of an H level (indicating "1") and an L level (indicating "0") when the potential appearing on readout data line RDL is a higher and lower, respectively, than comparison potential $V_R$. Dummy cell DC provides this comparison potential $V_R$ to readout circuit SA. Comparison potential $V_R$ is set to a potential between potential $V_H$ read out onto read bit line RBL when data of an H level is stored in memory cell MC and potential $V_L$ read out on read bit line RBL when data of an L level is stored in memory cell MC. Comparison potential $V_R$ is most preferably set to a potential of $(V_H+V_L/2)$.

Input/output buffer IOB receives an externally applied write data to provide the write data to write driver WD, and receives read out data from sense amplifier SA to provide the readout data to the outside world.

A data holding operation similar to that of the first embodiment can be carried out in the present embodiment since a data retaining current is supplied to storage node 2 via a path of first power supply potential node 4 and load element 3.

The writing operation of the present embodiment differs from that of the first embodiment in that write bit line WBL is used instead of bit line BL, write word line WWL is used instead of word line WL, write word line driver WWD is used instead of word line driver WD, and write data line WDL is used instead of data line DL. The remaining elements are similar to those of the first embodiment.

In a readout operation of the present embodiment, read bit line RBL and read word line RWL are used. When data in selected memory cell MC1 indicates "1", current flows to read access transistor 40 according to a path of first power supply potential node 4, bit line load transistor Q2, read bit line RBL1, and read access transistor 39 since the potential of storage node 2 connected to the gate electrode of read transistor 40 shows a high potential of $V_A$. Reduction in the potential of read bit line RBL1 is detected by detecting the potential of read data line RDL connected to read bit line RBL1 using sense amplifier SA. Thus, data "1" in memory cell MC1 can be read out.

When the data in selected memory cell MC1 is "0", read access transistor 40 conducts almost no current and there is substantially no change in the potential of read bit line RBL1 since the potential of storage node 2 connected to the gate electrode of read transistor 40 indicates a low potential of $V_B$. Therefore, by detecting the potential of read data line RDL connected to read bit line RBL1 using sense amplifier SA, data "0" can be read out from memory cell MC1.

Similar to the first embodiment, the SRAM of the present embodiment can have data held and written in a similar manner. Furthermore, data can be read out. In a data readout operation, no current flows to tunnel insulating film 20 of negative resistance element 5 constituting of an MIS switching diode. Therefore, reliability of tunnel insulation film 20 can be improved.

Thirteenth Embodiment

Figure 20:
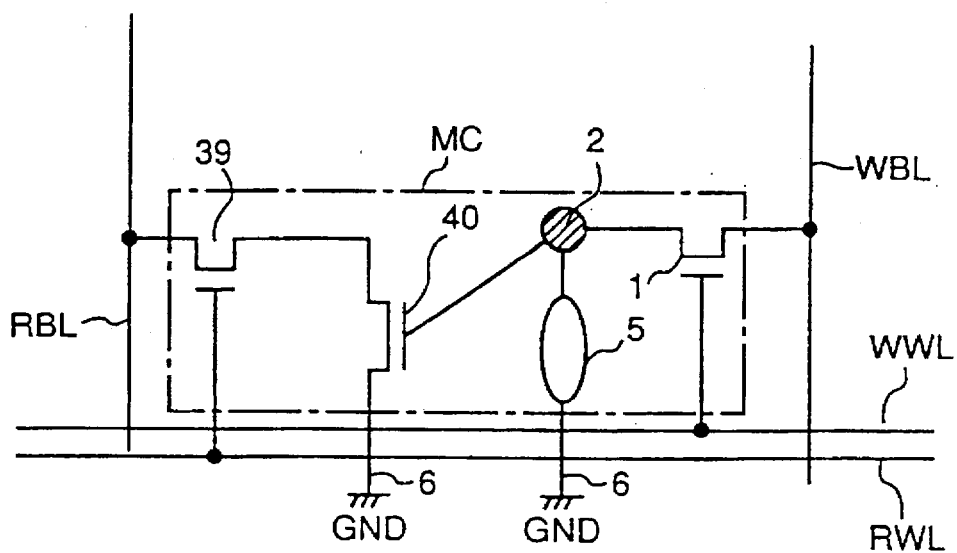
FIG. 20 is an equivalent circuit diagram showing a structure of a memory cell of an SRAM according to a thirteenth embodiment of the present invention.

FIG. 20 is a circuit diagram showing a structure of a memory cell in an SRAM according to a thirteenth embodiment of the present invention. In contrast to the twelfth embodiment in which memory cell MC is formed of five elements of an access transistor 1A, a load element 3A, a resistance element 5A, a read access transistor 39, and a read transistor 40, memory cell MC of the present embodiment is formed of four elements of access transistor 1, negative resistance element 5, read access transistor 39, and read transistor 40. The structure of the SRAM of the thirteenth embodiment differs from that of the twelfth embodiment in the structure associated with the difference of a memory cell MC formed of four elements. The remaining element are similar to those of the twelfth embodiment.

Components in FIG. 20 corresponding to those of FIG. 19 have the same reference characters allotted. Access transistor 1 formed of an N channel MOS transistor has a drain electrode connected to write bit line WBL of a corresponding column, a source electrode connected to storage node 2, and a gate electrode connected to write word line WWL of a corresponding row. Threshold voltage Vth (A) of access transistor 1 is set smaller than threshold voltage Vth (B) of bit line load transistors Q1 and Q3. When access transistor 1 has ground potential GND (second potential) applied to the gate electrode, a subthreshold current is supplied to storage node 2 according to power supplied to the drain region via first bit line load transistors Q1 and Q2 and write bit line WBL from first power supply potential node 4. The level of this current is preferably similar to that flowing in load element 3 of the twelfth embodiment.

During a non-selected state of memory cell MC and a data holding period in the SRAM of the present embodiment, subthreshold current of access transistor 1 is conducted to negative resistance element 5 according to power from first bit line load transistors Q1 and Q3 and write bit line WBL from the first power supply potential node 4. More specifically, the voltage-current characteristics β shown in FIG. 4 is obtained by access transistor 1. Thus, an operation and advantage similar to those of the twelfth embodiment are obtained. Furthermore, the occupying area of memory cell MC is reduced and the manufacturing step simplified in comparison to that of the twelfth embodiment since memory cell MC is formed of four elements.

Fourteenth Embodiment

Figure 21:
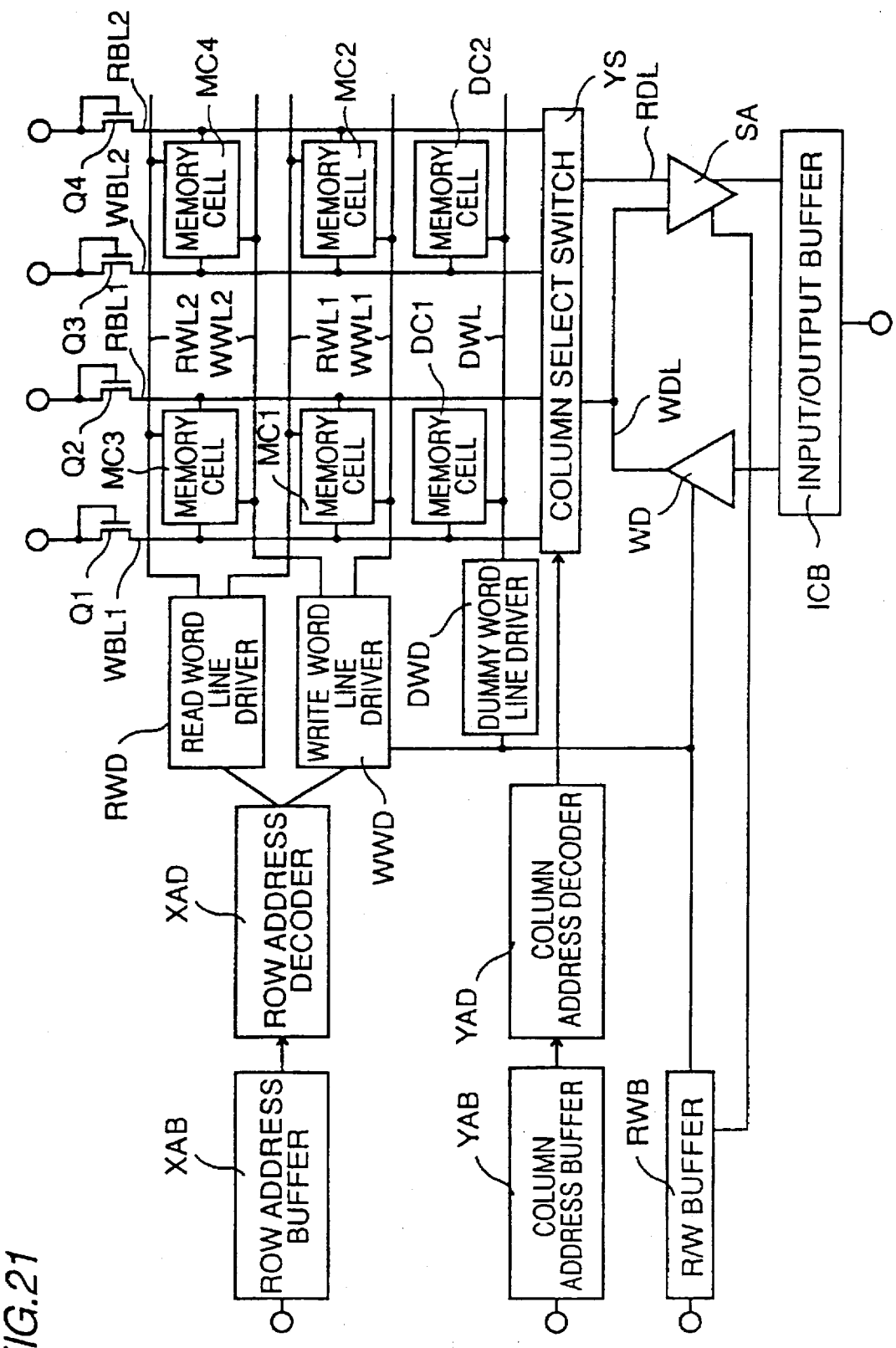
FIG. 21 is a circuit block diagram showing a structure of an SRAM according to a fourteenth embodiment of the present invention.

FIG. 21 is a block diagram showing a structure of an SRAM according to a fourteenth embodiment of the present invention. Referring to FIG. 21, the SRAM of the present embodiment is similar to that of the twelfth embodiment provided that data is read out by comparing the potential of read data line RDL connected to selected read bit line RBL and the potential of write data line WDL connected to write bit line WBL to which dummy memory cell DC is connected and forming a pair with that bit line. The remaining element are similar to those of the twelfth embodiment.

Components in FIG. 21 corresponding to those of the twelfth embodiment shown in FIG. 18 have the same reference characters allotted. An additionally-provided dummy word driver DWD receives an internal read/write signal from read/write buffer RWD to be rendered active when the received internal read/write signal indicates a readout operation (H level in the present embodiment) to supply first potential $V_{CC}$ to the connected dummy word line DWL. Dummy memory cells DC1 and DC2 forming a comparison potential generation circuit are connected to write bit lines WBL1 and WBL2, respectively. Dummy memory cells DC1 and DC2 are both connected to one dummy word line DWL connected to dummy word line driver DWD.

Similar to the twelfth embodiment, the SRAM having a memory cell MC of the present embodiment has data written/read and held to achieve similar advantages. Noise generated in reading out data can almost be completely canceled at the time of the comparing and sensing operation of the potential of write data line WDL connected to a corresponding bit line pair and read data line RDL by sense amplifier SA since the noise appearing in write bit line WBL and read bit line RBL to which selected memory cell is connected are substantially equal. Therefore, readout error is reduced.

Fifteenth Embodiment

Figure 22:
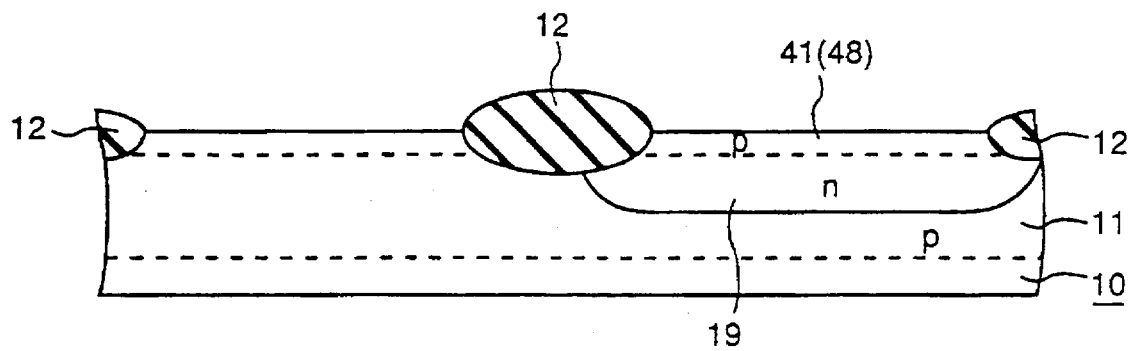
FIG. 22 is a sectional view of a semiconductor substrate for describing a structure of a memory cell of an SRAM according to a fifteenth embodiment of the present invention.
Figure 23:
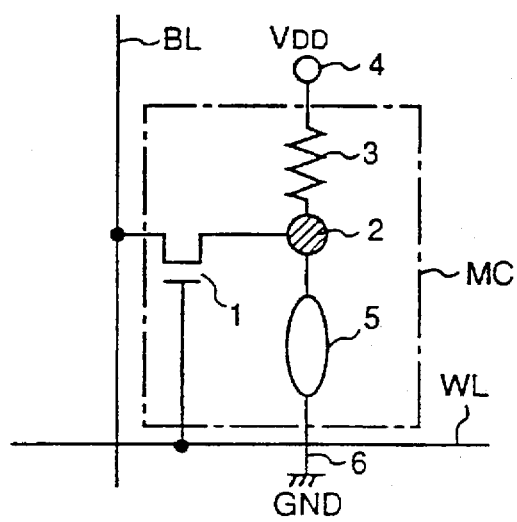
FIG. 23 is an equivalent circuit diagram showing a structure of a memory cell of a conventional SRAM.
Figure 24:
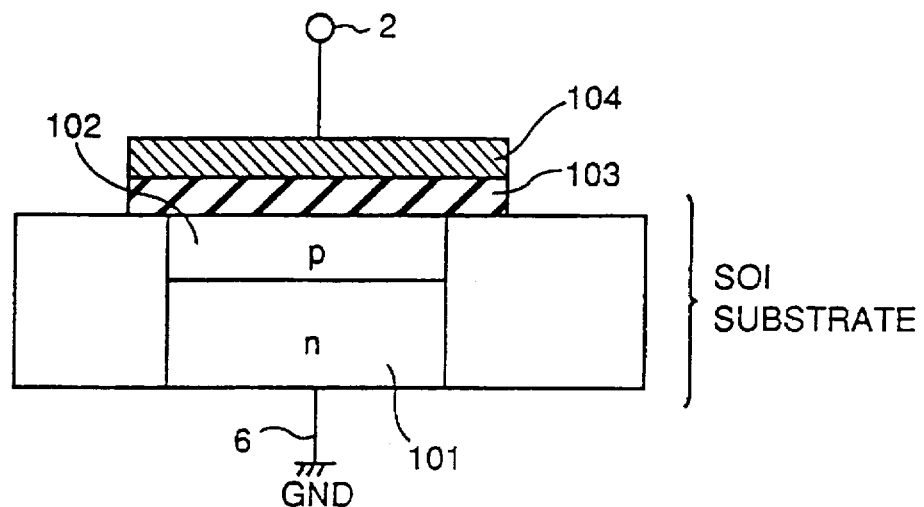
FIG. 24 is a sectional view showing a structure of a negative resistance element of FIG. 23.
Figure 25:
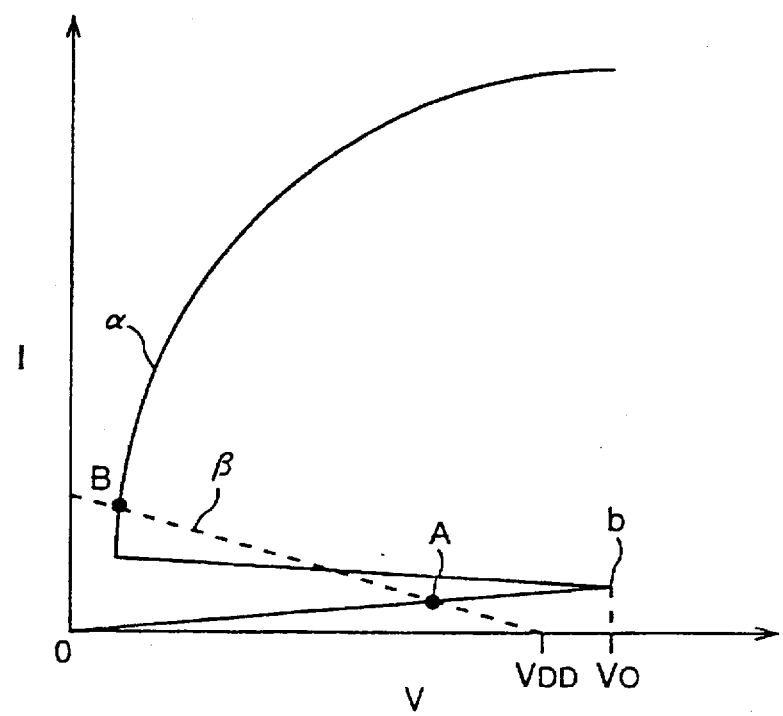
FIG. 25 is a current-voltage characteristic diagram of each element in a memory cell of FIG. 23.

FIG. 22 is a sectional view of an SRAM according to a fifteenth embodiment of the present invention showing the state of a memory cell MC right after P type semiconductor region 18 is formed. Memory cell MC of the present embodiment shown in FIG. 22 is similar to those of the first—fourteenth embodiments provided that P type semiconductor region 18 is formed using an epitaxial layer.

Similar to the above-described first to fourteenth embodiments, the SRAM of the present embodiment has data written/read and held to achieve similar advantages. Furthermore, the possibility of leakage current due to crystal defect can be reduced in comparison to the case where P type semiconductor region 18 is formed by another method (for example implantation).

Although the present invention has been described and illustrated in detail, it is clearly understood that the same is byway of illustration and example only and is not to be taken by way of limitation, the spirit and scope of the present invention being limited only by the terms of the appended claims.

What is claimed is:

1. A semiconductor memory device comprising:
   a plurality of memory cells arranged in a matrix of a plurality of rows and columns,
   a plurality of word lines arranged in a plurality of rows, each word line connected to a plurality of memory cells arranged in a corresponding row,
   a plurality of bit lines arranged in a plurality of columns, each bit line connected to a plurality of memory cells arranged in a corresponding column, and
   a plurality of bit line load transistors provided corresponding to said plurality of bit lines, each bit line load transistor connected between a first power supply potential node to which a first potential is supplied and a corresponding bit line,
   wherein each of said plurality of memory cells comprises
   an access transistor connected between a storage node and a bit line of a corresponding column, and having a gate electrode connected to a word line of a corresponding row, wherein a threshold voltage thereof is smaller than a threshold voltage of said bit line load transistor, and
   a negative resistance element connected between said storage node and a second power supply potential node to which a second potential lower than said first potential is supplied, and having a switching initiate voltage greater than a difference between said first potential and the threshold voltage of said bit line load transistor, and smaller than a difference between said first potential and the threshold voltage of said access transistor.

2. The semiconductor memory device according to claim 1, wherein each of said plurality of memory cells further comprises a load element connected between said first power supply potential node and said storage node.

3. The semiconductor memory device according to claim 2, wherein said load element of each of said plurality of memory cells includes a high resistance element.

4. The semiconductor memory device according to claim 1, further comprising:
   a data line,
   a write circuit for providing write data to said data line,
   a read circuit for sensing and amplifying a potential difference between a potential according to readout data on said data line DL and a comparison potential for providing an amplified output, and
   column select means responsive to an externally applied column address signal for selecting any of said plurality of bit lines, and connecting said selected bit line and said data line.

5. A semiconductor memory device comprising:
   a plurality of memory cells arranged in a matrix of a plurality of rows and columns,
   a plurality of word lines arranged in a plurality of rows, each word line connected to a plurality of memory cells arranged in a corresponding row,
   a plurality of bit lines arranged in a plurality of columns, each bit line connected to a plurality of memory cells arranged in a corresponding column,
   wherein each of said plurality of memory cells comprises
   an access transistor connected between a storage nodes and a bit line of a corresponding column, and having a gate electrode connected to a word line of a corresponding row,
   a load element connected between a first power supply potential node to which a first potential is supplied and said storage node,
   a negative resistance element connected between said storage node and a second power supply potential node to which a second potential lower than said first potential is supplied, and
   a capacitive element connected between said storage node and another power supply potential node to which another potential is supplied.

6. The semiconductor memory device according to claim 5, further comprising:
   a plurality of bit line load transistors provided corresponding to said plurality of bit lines, each bit line load transistor connected between said first power supply potential node and a corresponding bit line, and having a threshold voltage greater than a threshold voltage of said access transistor of said memory cell,
   wherein each negative resistance element of said plurality of memory cells has a switching initiate voltage greater than a difference between said first potential and the threshold voltage of said bit line load transistor, and smaller than a difference between said first potential and the threshold voltage of said access transistor.

7. The integrated semiconductor device according to claim 5, wherein the other power supply potential is the second potential.

8. A semiconductor memory device comprising:
   a plurality of memory cells arranged in a matrix of a plurality of rows and columns,
   a plurality of write word lines arranged in a plurality of rows, each write word line connected to a plurality of memory cells arranged in a corresponding row,
   a plurality of read word lines arranged in a plurality of rows, each read word line connected to a plurality of memory cells arranged in a corresponding row,
   a plurality of write bit lines arranged in a plurality of columns, each write bit line connected to a plurality of memory cells arranged in a corresponding column,
   a plurality of read bit lines arranged in a plurality of columns, each read bit line connected to a plurality of memory cells arranged in a corresponding column, and
   a first power supply potential node to which a first potential is supplied,
   wherein each of said plurality of memory cells comprises
   a write access transistor connected between a storage node and a write bit line of a corresponding column, and having a gate electrode connected to a write word line of a corresponding row,
   a negative resistance element connected between said storage node and a second power supply potential node to which a second potential lower than said first potential is supplied,
   a read access transistor having one main electrode connected to a read bit line of a corresponding column, and having an input electrode connected to a read word line of a corresponding row, and a read transistor connected between another main electrode of said read access transistor and a third power supply potential node to which a third potential lower than said first potential is supplied, and having a gate electrode connected to said storage node.

9. The semiconductor memory device according to claim 8, wherein each of said plurality of memory cells comprises a load element connected between said first power supply potential node and said storage node.

10. The semiconductor memory device according to claim 9, wherein each load element of said plurality of memory cells includes a high resistance element.

11. The semiconductor memory device according to claim 8, further comprising:

a plurality of write bit line load transistors provided corresponding to said plurality of write bit lines, each write bit line load transistor being connected between said first power supply potential node and a corresponding write bit line, and having a threshold voltage greater than a threshold voltage of said write access transistor of a memory cell, wherein each negative resistance element of said plurality of memory cells has a switching initiate voltage greater than a difference between said first potential and the threshold voltage of said write bit line load transistor, and smaller than a difference between said first potential and the threshold voltage of said write access transistor.

12. The semiconductor memory device according to claim 8, further comprising:

a write data line, a write circuit for providing write data to said write data line, a read data line, a read circuit for sensing and amplifying a potential difference between a potential according to read out data appearing on said readout data line and a comparison potential for providing an amplified output, and column select means responsive to an externally applied column address signal for selecting any of a plurality of write bit lines for connecting said selected write bit line with said write data line in a data writing operation, and for selecting any of a plurality of read bit lines for connecting said selected read bit line with said read data line in a data reading operation.

13. The semiconductor memory device according to claim 8, further comprising:

a write data line, a write circuit for providing write data to said write data line, a pair of read data lines, a read circuit for sensing and amplifying a potential difference appearing on said pair of read data lines for providing an amplified output, a comparison potential generation circuit for providing a comparison potential to each of said plurality of write bit lines in a data reading operation, column select means responsive to an externally applied column address signal, for selecting any of a plurality of write bit lines and connecting said selected write bit line with said write data line in a data writing operation, and for selecting any of a plurality of read bit lines and also a write bit line arranged in a column identical to that of said selected read bit line, and connecting said selected read bit line with one read data line of said pair of read data lines, and connecting said selected write bit line with the other read data line of said pair of read data lines.

* * * * *